US012641830B2

(12) United States Patent
Huang et al.

(10) Patent No.: US 12,641,830 B2
(45) Date of Patent: May 26, 2026

(54) VERTICAL SELF ALIGNED GATE ALL AROUND TRANSISTOR

(71) Applicant: Taiwan Semiconductor Manufacturing Co., Ltd., Hsinchu (TW)

(72) Inventors: Yu-Xuan Huang, Hsinchu (TW); Hou-Yu Chen, Hsinchu (TW); Cheng-Ting Chung, Hsinchu (TW); Jin Cai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 369 days.

(21) Appl. No.: 18/311,161

(22) Filed: May 2, 2023

(65) Prior Publication Data

US 2024/0194756 A1     Jun. 13, 2024

Related U.S. Application Data

(60) Provisional application No. 63/387,064, filed on Dec. 12, 2022.

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 84/01* | (2026.01) |

(Continued)

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01);

*H10D 84/0128* (2025.01); *H10D 84/013* (2025.01); *H10D 84/0151* (2025.01); *H10D 84/038* (2025.01); *H10D 84/83* (2025.01)

(58) Field of Classification Search
CPC ........... H10D 30/6735; H10D 30/6757; H10D 84/038; H10D 84/0151; H10D 84/0128; H10D 84/0147; H10D 62/121; H10D 30/014; H10D 30/43
See application file for complete search history.

(56) References Cited

U.S. PATENT DOCUMENTS

| | | |
|---|---|---|
| 8,823,065 B2 | 9/2014 | Wang et al. |
| 9,105,490 B2 | 8/2015 | Wang et al. |

(Continued)

FOREIGN PATENT DOCUMENTS

| | | |
|---|---|---|
| KR | 20150143262 A | 12/2015 |
| KR | 20170142094 A | 12/2017 |

(Continued)

*Primary Examiner* — Changhyun Yi
(74) *Attorney, Agent, or Firm* — Seed IP Law Group

(57)     ABSTRACT

A method for forming vertical gate all around transistors includes forming stack of semiconductor layers on a lower source/drain region. The stack of semiconductor layers includes a first layer, a second layer on the first layer, and a third layer on the second layer. The first and third layers have substantially identical compositions and are selectively etchable with respect to the second layer. The first and second layers can be selectively removed and replaced with inner spacers. The second layer can be selectively removed and replaced with a gate electrode.

20 Claims, 27 Drawing Sheets

(51) Int. Cl.
H10D 84/03 (2025.01)
H10D 84/83 (2025.01)

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 11,502,183 B2 | 11/2022 | Yao et al. |
| 2017/0110554 A1 | 4/2017 | Tak et al. |
| 2019/0123163 A1 | 4/2019 | Yang et al. |
| 2019/0165173 A1* | 5/2019 | Liu .................... H10D 62/822 |

| | | |
|---|---|---|
| 2020/0083219 A1* | 3/2020 | Kang .................... B82Y 10/00 |
| 2020/0227570 A1 | 7/2020 | Chen et al. |
| 2020/0350313 A1 | 11/2020 | Xie et al. |
| 2021/0013106 A1 | 1/2021 | Xie et al. |
| 2021/0305364 A1 | 9/2021 | Li et al. |
| 2021/0313449 A1 | 10/2021 | Lin et al. |
| 2022/0077301 A1* | 3/2022 | Kang .................... H10D 62/121 |
| 2022/0102492 A1 | 3/2022 | Gardner et al. |
| 2022/0359294 A1 | 11/2022 | Gardner et al. |
| 2022/0367289 A1 | 11/2022 | Fulford et al. |
| 2022/0367623 A1 | 11/2022 | Lee et al. |
| 2022/0392918 A1 | 12/2022 | Choi et al. |

FOREIGN PATENT DOCUMENTS

| | | |
|---|---|---|
| KR | 1020170133749 A | 12/2017 |
| KR | 20200051477 A | 5/2020 |
| KR | 1020220133222 A | 10/2022 |
| TW | 556289 B | 10/2003 |
| TW | 202211371 A | 3/2022 |
| TW | 202230626 A | 8/2022 |

\* cited by examiner

1600

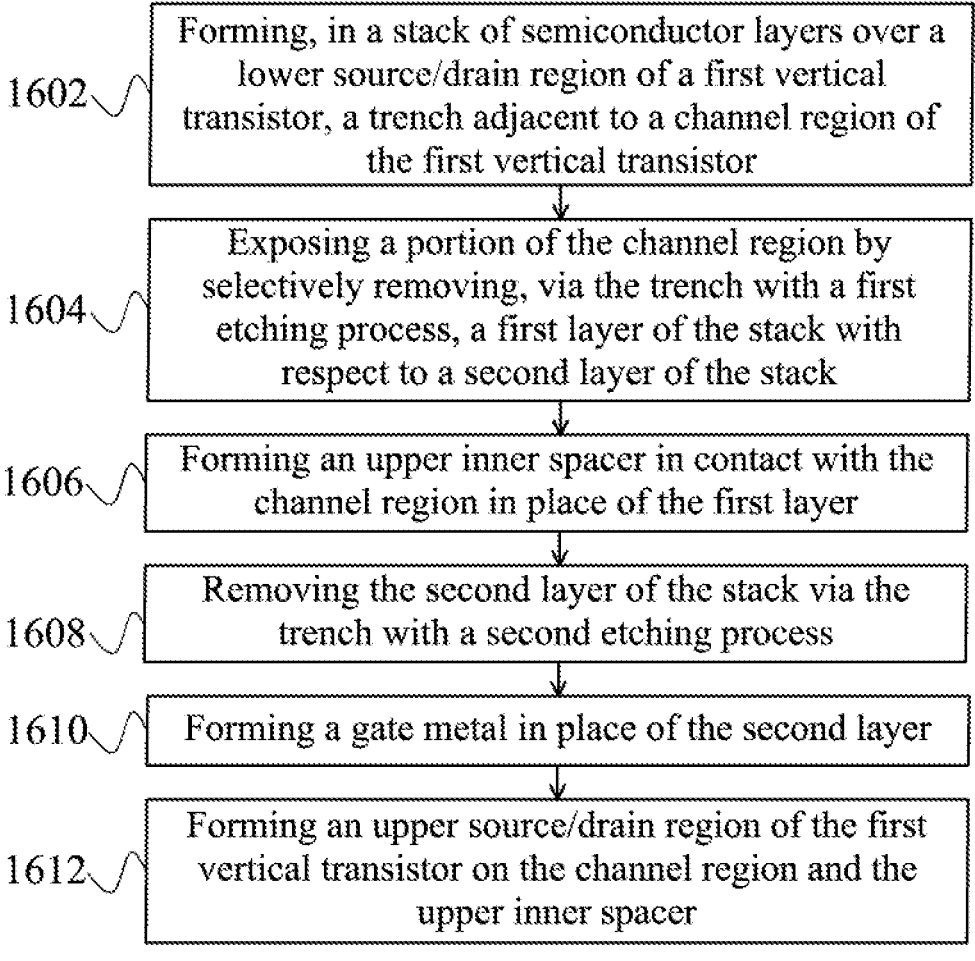

1602 — Forming, in a stack of semiconductor layers over a lower source/drain region of a first vertical transistor, a trench adjacent to a channel region of the first vertical transistor 1604 — Exposing a portion of the channel region by selectively removing, via the trench with a first etching process, a first layer of the stack with respect to a second layer of the stack 1606 — Forming an upper inner spacer in contact with the channel region in place of the first layer 1608 — Removing the second layer of the stack via the trench with a second etching process 1610 — Forming a gate metal in place of the second layer 1612 — Forming an upper source/drain region of the first vertical transistor on the channel region and the upper inner spacer

Figure 16

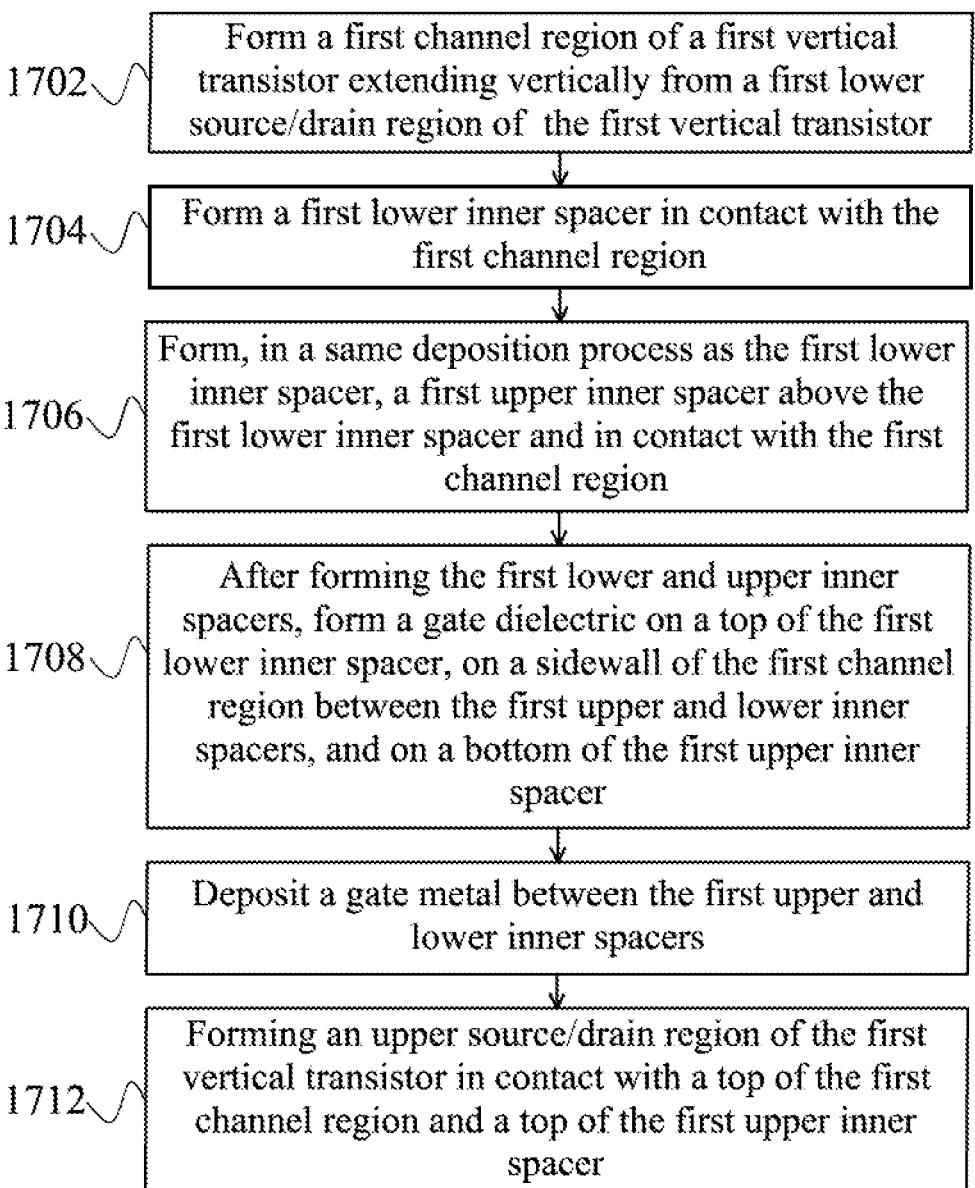

1700

1702 — Form a first channel region of a first vertical transistor extending vertically from a first lower source/drain region of the first vertical transistor 1704 — Form a first lower inner spacer in contact with the first channel region 1706 — Form, in a same deposition process as the first lower inner spacer, a first upper inner spacer above the first lower inner spacer and in contact with the first channel region 1708 — After forming the first lower and upper inner spacers, form a gate dielectric on a top of the first lower inner spacer, on a sidewall of the first channel region between the first upper and lower inner spacers, and on a bottom of the first upper inner spacer 1710 — Deposit a gate metal between the first upper and lower inner spacers 1712 — Forming an upper source/drain region of the first vertical transistor in contact with a top of the first channel region and a top of the first upper inner spacer

Figure 17

VERTICAL SELF ALIGNED GATE ALL AROUND TRANSISTOR

BACKGROUND

The semiconductor integrated circuit industry has experienced exponential growth. Technological advances in integrated circuit materials and design have produced generations of integrated circuits where each generation has smaller and more complex circuits than the previous generation. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a flow diagram of a method for forming an integrated circuit, in accordance with some embodiments.

FIG. 17 is a flow diagram of a method for forming an integrated circuit, in accordance with some embodiments.

DETAILED DESCRIPTION

Figures 1A, 1B:
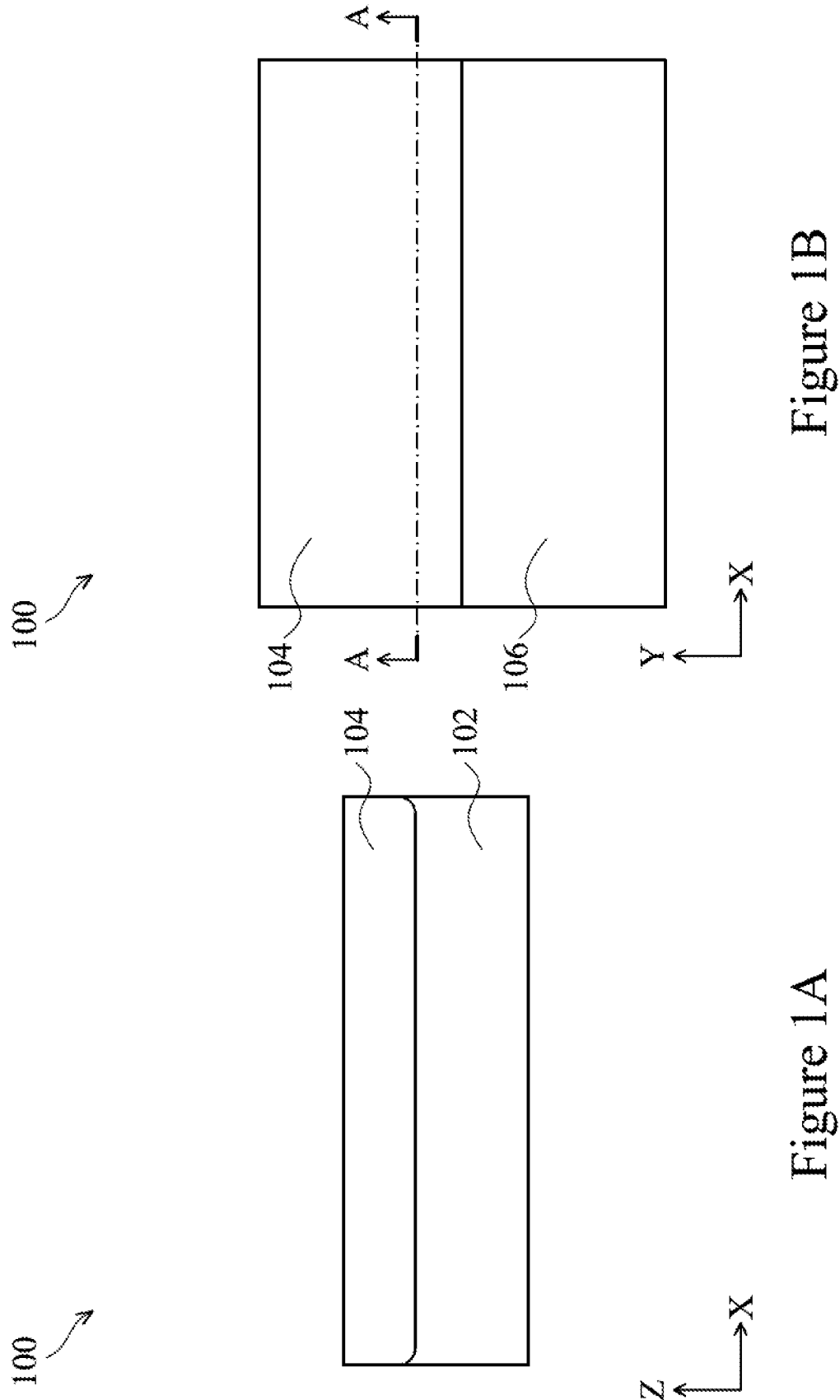
FIGS. 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, 1X, 1Y, 1Z, 2A, 2B, 2C, 2D, 2E, and 2F are cross-sectional and top views of an integrated circuit at various stages of processing, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about." "substantially." and the like, should be interpreted as one having ordinary skill in the art would in view of current technological norms.

The present disclosure is generally related to semiconductor devices, and more particularly to field-effect transistors (FETs), such as planar FETs, three-dimensional fin FETs (FinFETs), or nanostructure devices. Examples of nanostructure devices include gate-all-around (GAA) devices, nanosheet FETs (NSFETs), nanowire FETs (NWFETs), and the like. In advanced technology nodes, active area spacing between nanostructure devices is generally uniform, source/drain epitaxy structures are symmetrical, and a metal gate surrounds four sides of the nanostructures (e.g., nanosheets). Gate-drain capacitance ("Cgd") is increased due to larger metal gate endcap and increased source/drain epitaxy size.

Embodiments of the disclosure reduce active area spacing, and improve scaling of integrated circuit cell dimensions. In some embodiments, a vertical nanostructure transistor is formed. The vertical nanostructure transistor may include a lower source/drain region, and upper source/drain region, and a semiconductor nanostructure channel region extending vertically between the lower source/drain region and the upper source/drain region. A gate electrode laterally surrounds the semiconductor nanostructure channel region. The process for forming the vertical nanostructure transistor may include forming a stack of semiconductor layers having different material concentrations such that various layers of the semiconductor stack are selectively etchable with respect to each other. Formation of the stack of semiconductor layers enables precise control and definition of the dimensions of inner spacers, gate electrodes, and other structures of the vertical nanostructure transistor. The result is more efficient use of integrated circuit area, simpler and more compact formation of source/drain contacts, and reduction of various other damages.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

FIG. 1A is a cross-sectional view of the integrated circuit 100 at an intermediate stage of processing, in accordance with one embodiment. FIG. 1B is a top view of the integrated circuit 100 of FIG. 1A, in accordance with one embodiment. In the cross-sectional view of FIG. 1A, the z-axis corresponds to the vertical axis, while the x-axis corresponds to a lateral axis substantially orthogonal to the z-axis. In the top view of FIG. 1B, the y-axis and the x-axis are mutually orthogonal lateral axes. FIG. 1B illustrates the cut lines A corresponding to the line along which the cross-section of FIG. 1A is taken. In subsequent figures, when a cross-sectional view is juxtaposed with a top view and a cut line is not shown, the cut line may correspond to the cut line A of FIG. 1B.

The integrated circuit 100 includes a substrate 102. The substrate 102 may be a semiconductor substrate, such as a bulk semiconductor, or the like, which may be doped (e.g., with a p-type or an n-type dopant) or undoped. The semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

With reference to FIG. 1A, a lower source/drain region 104 has been formed in the substrate 102. The lower source/drain region 104 may correspond to the same semiconductor material as the substrate 102, but doped with dopant atoms to impart either an N-type or P-type conductivity, as the case may be. The source/drain region 104 may have a vertical thickness between 5 nm and 20 nm, though other thicknesses can be utilized without departing from the scope of the present disclosure. While FIG. 1A illustrates the source/drain region 104 as having rounded edges, in practice, the source/drain region 104 may have other shapes and profiles without departing from the scope of the present disclosure.

In some embodiments, the source/drain region 104 is grown epitaxially from the substrate 102. In one example, the substrate 102 is silicon and the source/drain region 104 is silicon germanium. In some embodiments, the source/drain region 104 includes between 40% and 50% germanium, though other concentrations of germanium can be utilized without departing from the scope of the present disclosure. The source/drain region 104 may be doped in situ during the epitaxial growth process that forms the source/drain region.

In one embodiment, the source/drain region 104 is formed with a dopant implantation process. The dopant implantation process can implant selected dopant species into the upper region of the substrate 102 in order to form the source/drain region 104. In an example in which the source/drain region is an N-type source/drain region, the dopant implantation process may implant phosphorus or other types of N-type dopants species. In the example in which the source/drain region 104 is a P-type source/drain region, the dopant implantation process may implant boron or other types of P-type dopant species. The source/drain region 104 is described as a "lower" source/drain region, because an upper source/drain region will eventually be formed above the lower source/drain region 104 with a semiconductor nanostructure channel region extending between the source/drain region 104 and the upper source/drain region. The term "source/drain region" may correspond to a source region or a drain region of a transistor. Typically a transistor may include a source region and the drain region. The source and drain regions are similar and that is the configuration of the corresponding circuit and that they determine whether a region is a source region or a drain region. Accordingly, the term source/drain region is utilized, because the region may be a source region or a drain region.

The top view of FIG. 1B illustrates that a second lower source/drain region 106 has been formed. The second source/drain region 106 may have an opposite conductivity type as the source/drain region 104. For example, if the source/drain region 104 is a P-type source/drain region, then the source/drain region 106 will be an N-type source/drain region, and vice versa. The source/drain region 106 can be formed the same manner as described in relation to the source/drain region 104. In the case of dopant implantation, masks may be formed and patterned to enable separate doping processes for the source/drain regions 104 and 106. For example, a first mask may cover the area of the source/drain region 106 while dopant species are implanted to form the source/drain region 104. A second mask may then cover the area of the source/drain region 104 while dopant species are implanted to form the source/drain region 106. Various processes can be utilized to form the source/drain regions 104 and 106 without departing from the scope of the present disclosure.

As will be set forth in more detail below, the source/drain region 104 will correspond to a lower source/drain region 104 for a plurality of vertical nanostructure transistors in which current will flow vertically through semiconductor nanostructure channel regions between the lower source/drain region 104 and an upper source/drain region that will be described further below.

Figure 1C:
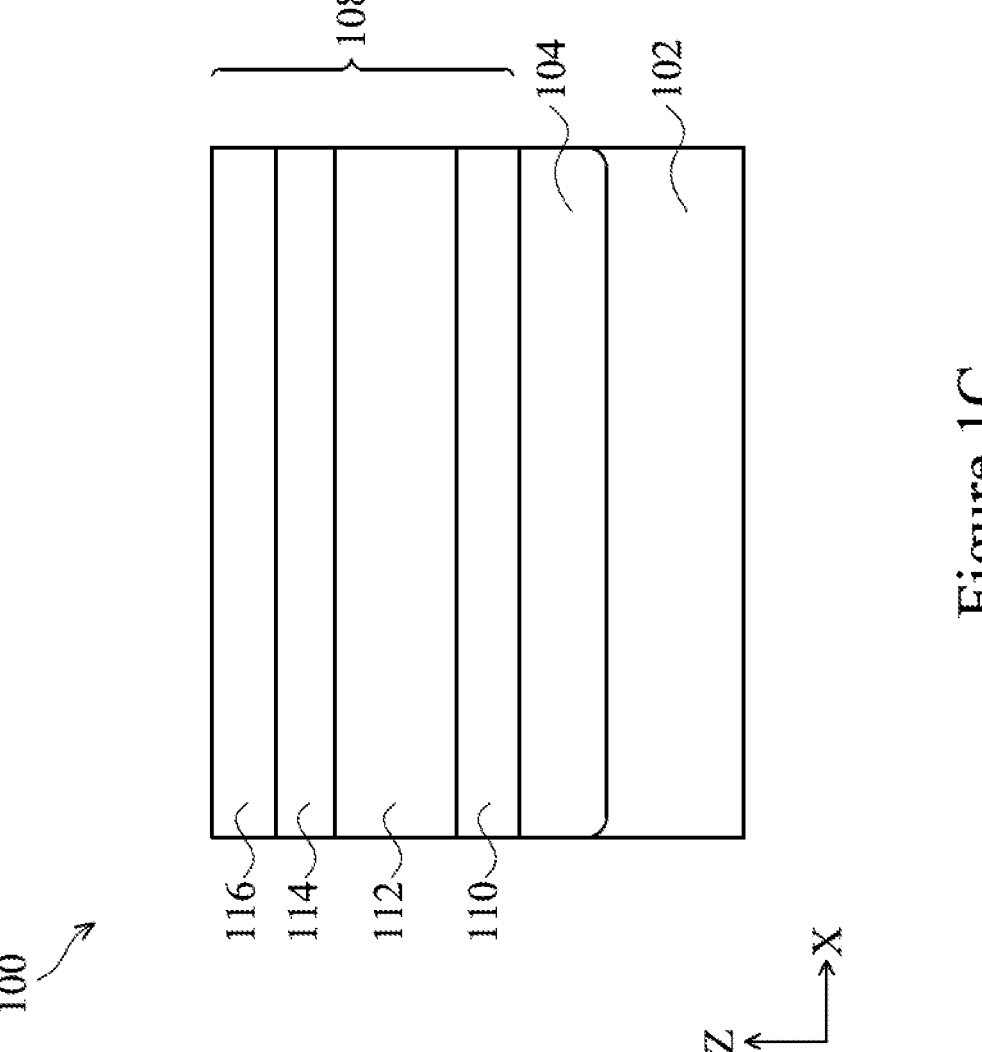

FIG. 1C is a cross-sectional view of the integrated circuit 100, in accordance with some embodiments. In FIG. 1C, a stack of semiconductor layers 108 has been formed on the substrate 102. In particular, the stack of semiconductor layers 108 has been formed on a top surface of the source/drain region 104. The stack of semiconductor layers 108 includes a plurality of layers of semiconductor material. As will be set forth in more detail below, the formation of the stack of semiconductor layers 108 can enable precise control of the shapes and sizes of structures of the vertical nanostructure transistors that will be formed. In particular, formation of the stack of semiconductor layers 108 can help control the shapes and sizes of the semiconductor nanostructures corresponding to channel regions of the nanostructure transistors. The stack of semiconductor layers 108 may correspond to a lattice of semiconductor layers or a super lattice of semiconductor layers.

In some embodiments, the stack of semiconductor layers 108 includes a first semiconductor layer 110. The first semiconductor layer 110 is positioned directly on the source/drain region 104. The first semiconductor layer 110 may be formed with an epitaxial growth process from the source/drain region 104. The first semiconductor layer 110 may include silicon germanium having a different concentration of germanium than the source/drain region 104 (in examples in which the source/drain region 104 includes silicon germanium). For example, the source/drain region 104 may include between 40% and 50% germanium concentration, while the first semiconductor layer 110 may include between 15% and 25% germanium concentration. The difference in concentration of germanium between the first semiconductor layer 110 and the source/drain region 104 can enable selective etching of the first semiconductor layer 110 with respect to the source/drain region 104. The first semiconductor layer 110 may have a thickness between 5 nm and 10 nm. Other thicknesses, materials, deposition processes, and material concentrations may be utilized for the first semiconductor layer 110 of the stack of semiconductor layers 108 without departing from the scope of the present disclosure.

In some embodiments, the stack of semiconductor layers 108 includes a second semiconductor layer 112. The second semiconductor layer 112 is positioned directly on the first semiconductor layer 110. The second semiconductor layer 112 may be formed with an epitaxial growth process from the first semiconductor layer 110. The second semiconductor layer 112 may include silicon germanium having a different concentration of germanium than the first semiconductor layer 110 (in examples in which the first semiconductor layer 110 includes silicon germanium). For example, the second semiconductor layer 112 may have between 30% and 50% germanium concentration. The difference in concentration of germanium between the first semiconductor layer 110 and the second semiconductor layer 112 can enable selective etching of the second semiconductor layer 112 with respect to the first semiconductor layer 110. The second semiconductor layer 112 may have a thickness between 10 nm and 15 nm. Other thicknesses, materials, deposition processes, and material concentrations may be utilized for the second semiconductor layer 112 of the stack of semiconductor layers 108 without departing from the scope of the present disclosure.

In some embodiments, the stack of semiconductor layers 108 includes a third semiconductor layer 114. The third semiconductor layer 114 is positioned directly on the second semiconductor layer 112. The third semiconductor layer 114 may be formed with an epitaxial growth process from the second semiconductor layer 112. The third semiconductor layer 114 may include silicon germanium having a different concentration of germanium than the second semiconductor layer 112. For example, the third semiconductor layer 114 may have a same germanium concentration as the first semiconductor layer 110 (between 15% and 25%) and may have a same thickness as the first semiconductor layer 110 (between 5 nm and 10 nm). The difference in concentration of germanium between the third semiconductor layer 114 and the second semiconductor layer 112 can enable selective etching of the second semiconductor layer 112 with respect to the third semiconductor layer 114. Other thicknesses, materials, deposition processes, and material concentrations may be utilized for the third semiconductor layer 114 of the stack of semiconductor layers 108 without departing from the scope of the present disclosure.

In some embodiments, the stack of semiconductor layers 108 includes a fourth semiconductor layer 116. The fourth semiconductor layer 116 is formed directly on the third semiconductor layer 114. In the example in which the third semiconductor layer 114 is silicon germanium, the fourth semiconductor layer 116 may include silicon. The fourth semiconductor layer 116 may be formed with an epitaxial growth process from the third semiconductor layer 114. The fourth semiconductor layer 116 may include an intrinsic semiconductor. The fourth semiconductor layer 116 may have a thickness between 5 nm and 20 nm. Other thicknesses, materials, and deposition processes may be utilized for the fourth semiconductor layer 116 without departing from the scope of the present disclosure.

While FIG. 1C illustrates a stack of semiconductor layers 108 having four semiconductor layers, other configurations of a stack of semiconductor layers 108 can be utilized without departing from the scope of the present disclosure. For example, the stack of semiconductor layers 108 can have different numbers of layers, different materials, and different configurations without departing from the scope of the present disclosure.

Figures 1D, 1E:
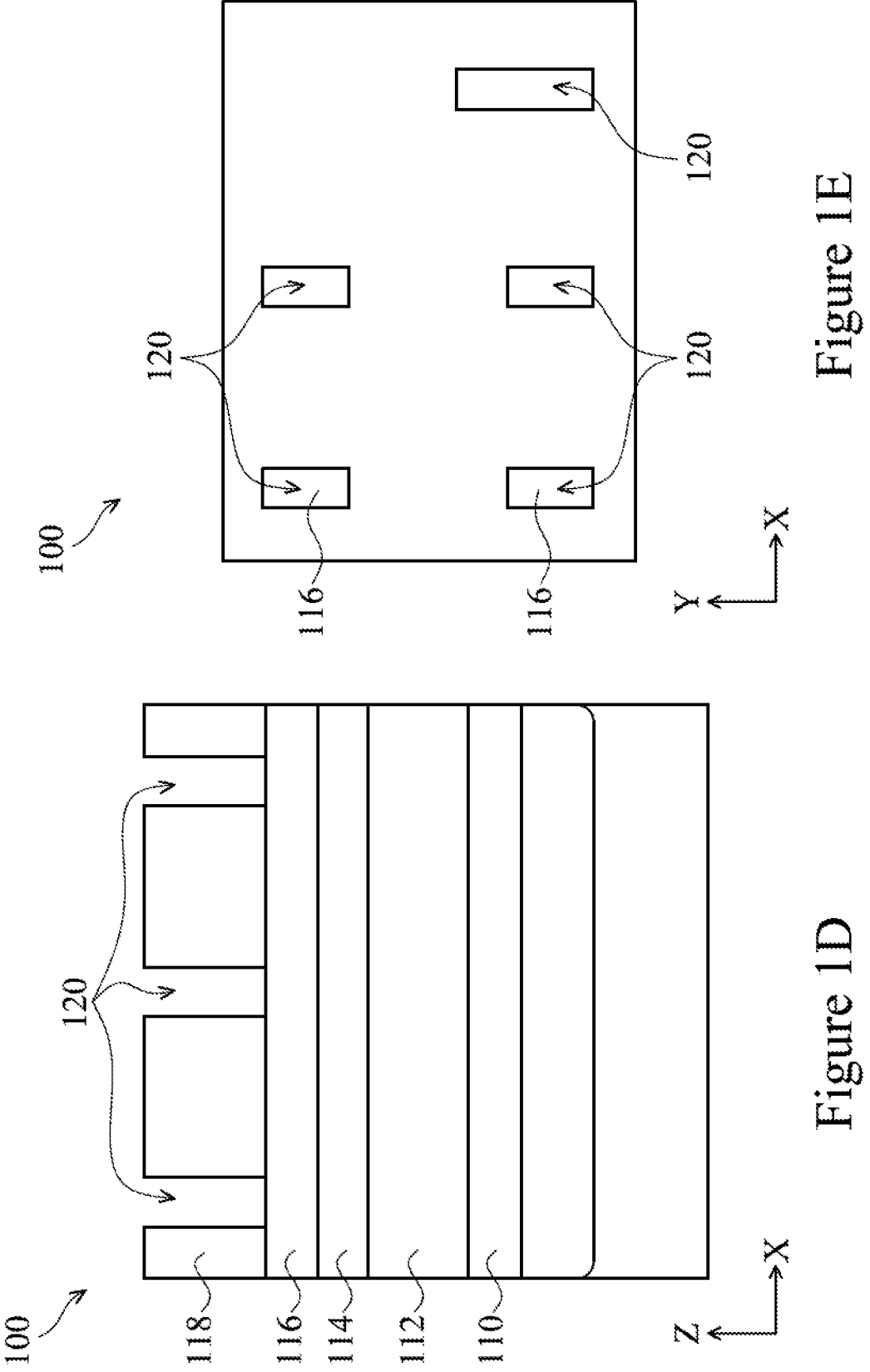

FIG. 1D is a cross-sectional view of the integrated circuit 100, in accordance with some embodiments. FIG. 1E is a top view of the integrated circuit 100 at the stage processing stage shown in FIG. 1D. In FIG. 1D, a hard mask layer 118 has been deposited on the fourth semiconductor layer 116. The hard mask layer 118 can include amorphous silicon, silicon nitride, SiCN, SiOC, SiOCN, HfO2, ZrO2, HfAlO, HfSiO, Al$_2$O$_3$, or other suitable materials. The hard mask layer 118 can have a thickness between 40 nm and 60 nm. The hard mask layer 118 can be deposited by chemical vapor deposition (CVD), physical vapor deposition (PVD), atomic layer deposition (ALD), or other suitable deposition processes. The hard mask layer 118 can include other thicknesses, materials, and deposition processes without departing from the scope of the present disclosure.

In FIGS. 1D and 1E, the trenches 120 have been formed in the hard mask layer 118. The trenches 120 expose selected portions of the fourth semiconductor layer 116. The trenches 120 can have a width between 10 nm and 80 nm. Furthermore, the trenches 120 may have differing widths from each other. For example, the furthest trench 120 to the right has a larger width than the other trenches 120. The trenches 120 can be formed utilizing a photolithography process including patterning the hard mask layer 118 in accordance with a photolithography mask.

Figures 1F, 1G:
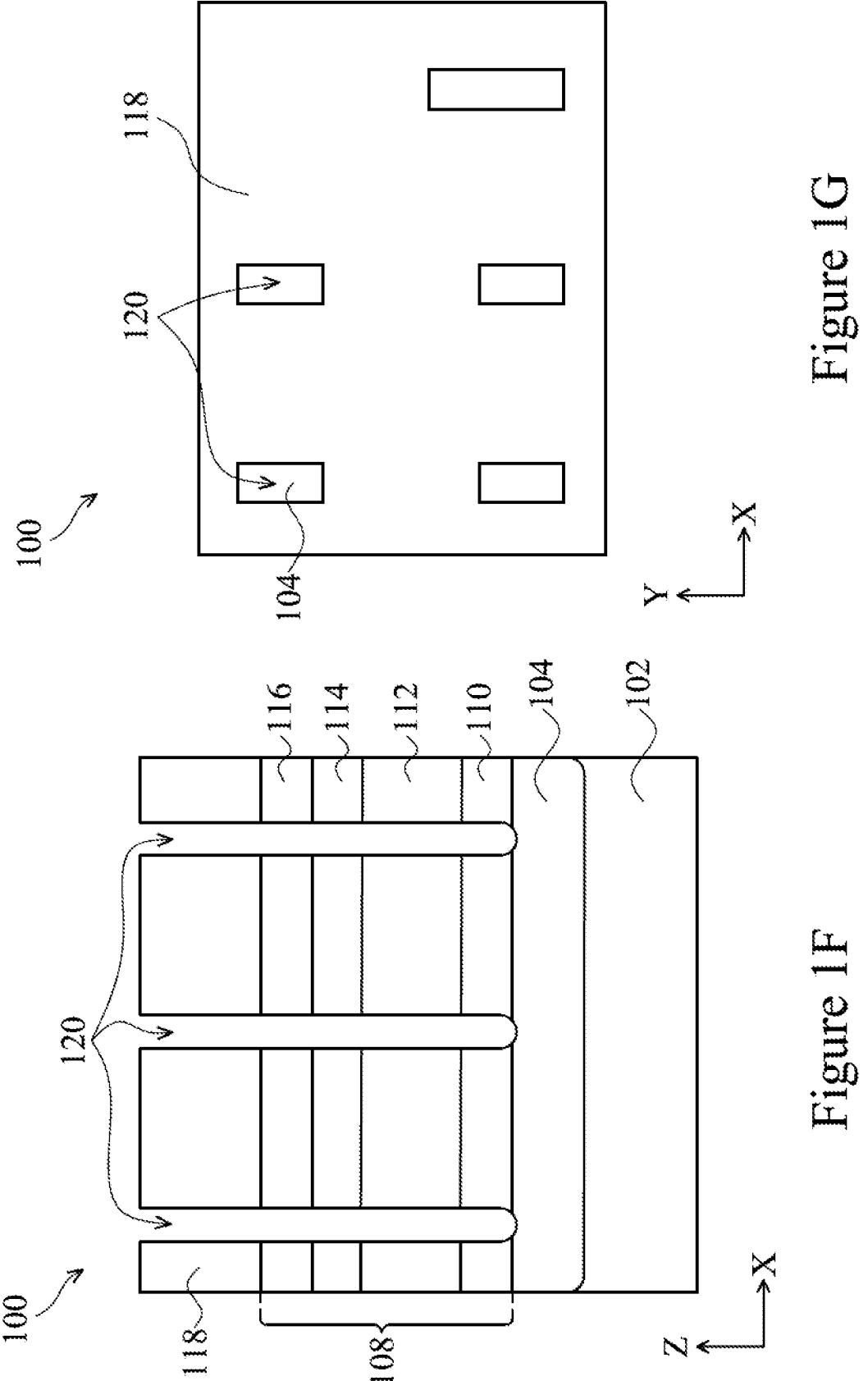

FIG. 1F is a cross-sectional view of the integrated circuit 100, in accordance with some embodiments. FIG. 1G is a top view of the integrated circuit 100 at the processing stage of FIG. 1F, in accordance with some embodiments. In FIG. 1F, the trenches 120 have been extended through the layers of the stack of semiconductor layers 108 to the source/drain region 104. The trenches 120 can be extended through the stack of semiconductor layers 108 by performing one or more etching processes. The etching processes can include an isotropic etching process that selectively etches in the downward direction. The etching processes can include dry etches, wet etches, or other types of etching processes. The etching processes etch the portions of the first, second, third, and fourth semiconductor layers 110-116 below the openings in the hard mask layer 118. The etching processes stop at the source/drain region 104. Accordingly, the source/drain region 104 may correspond to an etch stop layer. In some embodiments, a small portion of the source/drain regions 104 is also etched. For example, the trenches 120 may extend into the source/drain region 104 to a depth between 0 nm and 5 nm. In some embodiments, if the trenches 120 extend more than 5 nm into the source/drain region 104, then a resistance associated with the source/drain region 104 may become too high.

The trenches 120 may correspond to channel trenches. This is because semiconductor nanostructures corresponding to channel regions of the vertical nanostructure transistors will be formed in the trenches 120 in contact with the source/drain region 104.

Figures 1H, 1I:
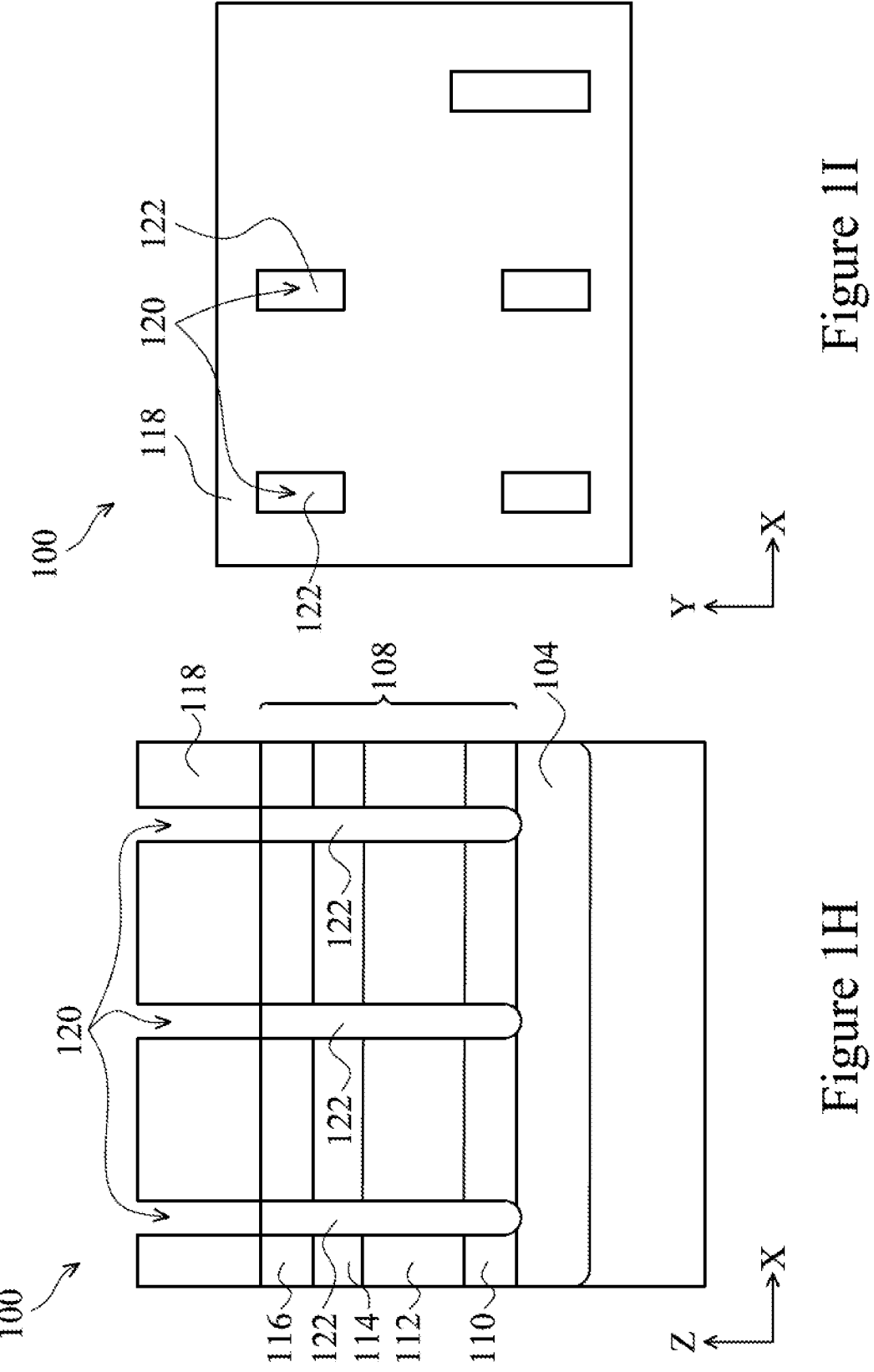

FIG. 1H is a cross-sectional view of the integrated circuit 100, in accordance with some embodiments. FIG. 1I is a top view of the integrated circuit 100 of FIG. 1H, in accordance with some embodiments. Semiconductor nanostructures 122 have been formed in the trenches 120. The semiconductor nanostructures 122 can be formed by an epitaxial growth from the various exposed semiconductor layers including one or more of the source/drain region 104, and the first, second, third, and fourth semiconductor layers 110-116 of the stack of semiconductor layers 108.

The semiconductor nanostructures 122 can include silicon, silicon germanium, or other suitable semiconductor materials. The semiconductor nanostructures 122 can correspond to channel regions of transistors. In particular, each semiconductor nanostructure 122 may correspond to a vertical channel region of a respective vertical nanostructure transistor.

The top of the semiconductor nanostructures 122 may be substantially even with the top surface of the fourth semiconductor layer 116. Alternatively, the top of the semiconductor nanostructures 122 may be higher or lower than the top surface of the fourth semiconductor layer 116. In some embodiments, the top of the semiconductor nanostructures 122 is within 2 nm of the top surface of the fourth semiconductor layer 116.

Figures 1J, 1K:
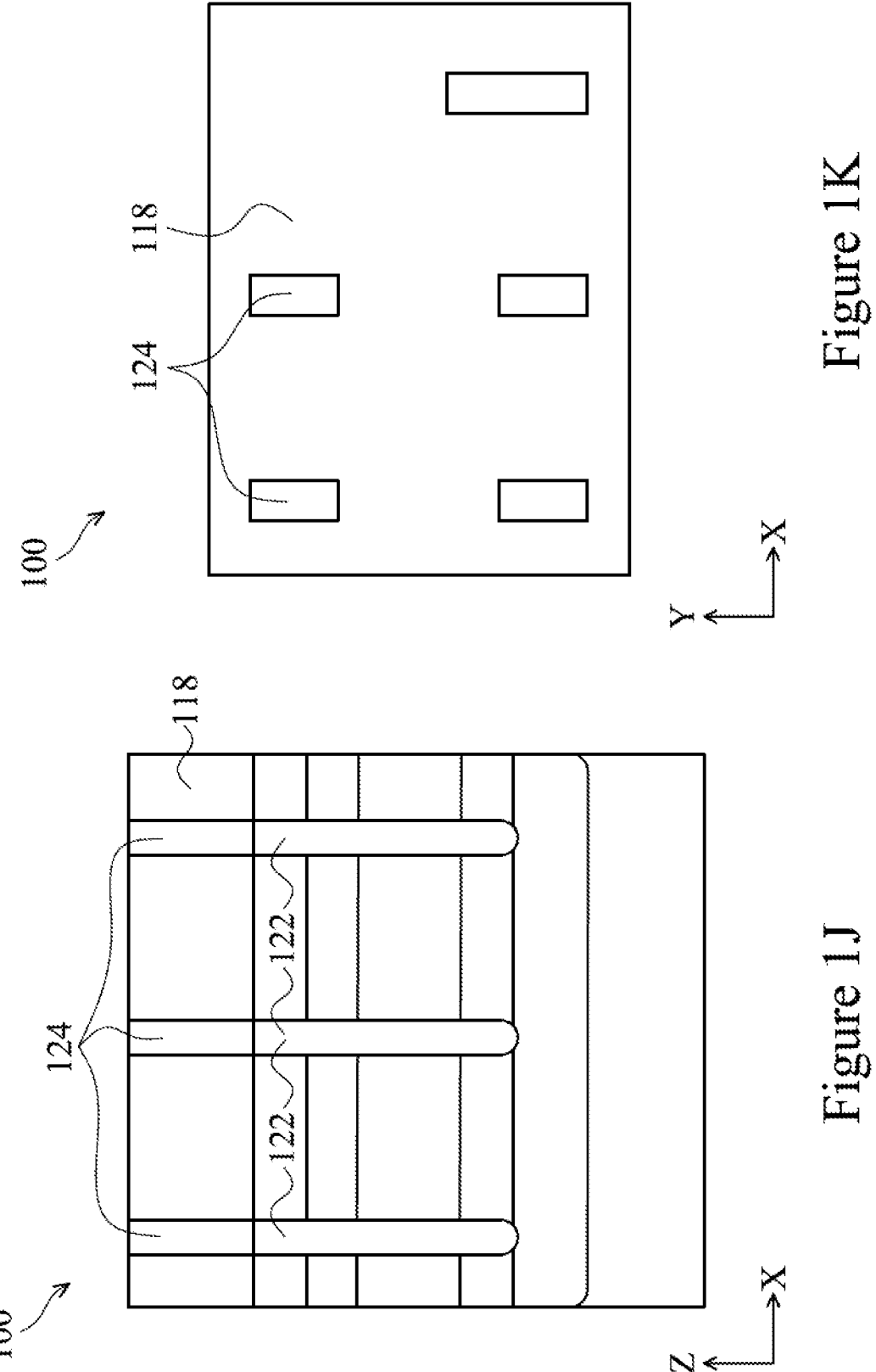

FIG. 1J is a cross-sectional view of the integrated circuit 100 at an intermediate stage of processing, in accordance with some embodiments. FIG. 1K is a top view of the integrated circuit 100 at the stage of processing of FIG. 1J, in accordance with some embodiments. In FIGS. 1J and 1K, a hard mask refill process has been performed. In particular, a hard mask material 124 has been deposited in the trenches 120 above the semiconductor nanostructures 122. The hard mask material 124 is configured as columns of material within the hard mask 118. The hard mask material 124 is in contact with the top surface of the semiconductor nanostructures 122. Though not shown in FIGS. 1J and 1K, the hard mask material 124 may initially be deposited on the top surface of the hard mask layer 118. A chemical mechanical planarization (CMP) process is then performed to remove the hard mask material 124 from the top surface of the hard mask layer 118.

In some embodiments, the hard mask material 124 is a different material than the hard mask layer 118. In particular, the hard mask material 124 may be selected to have etch selectivity with respect to the hard mask layer 118. The hard mask material can include amorphous silicon, SiN, SICN, SiOC, SiOCN, HfO2, ZrO2, HfAlO, HfSiO, Al2O3, or other suitable materials. The hard mask material 124 may be deposited by CVD, PVD, or ALD. Other materials and deposition processes can be utilized for the hard mask material 124 without departing from the scope of the present disclosure.

Figures 1L, 1M:
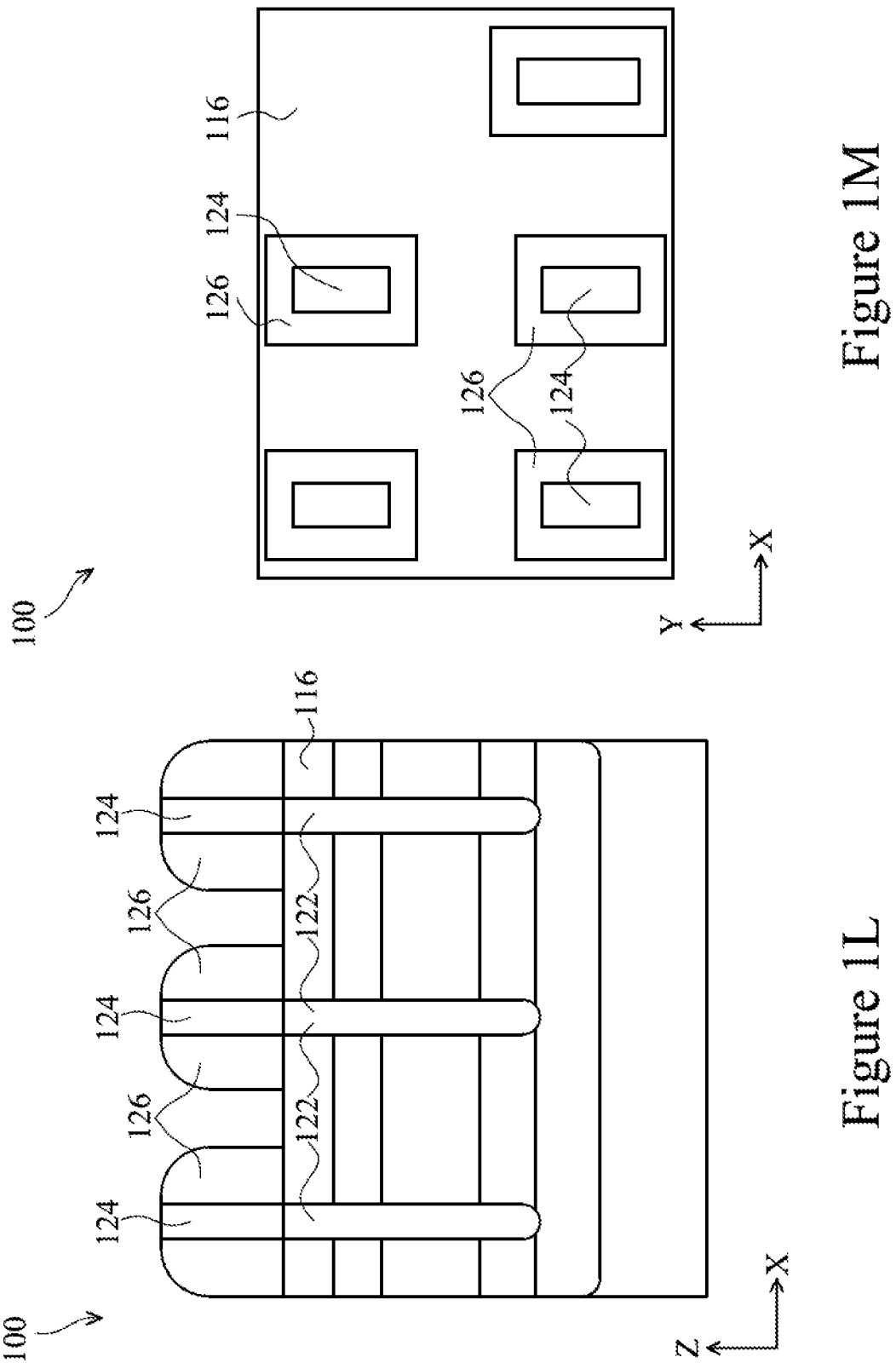

FIG. 1L is a cross-sectional view of the integrated circuit 100 at an intermediate stage of processing, in accordance with some embodiments. FIG. 1M is a top view of the integrated circuit 100 at the stage of processing of FIG. 1L, in accordance with some embodiments. In FIG. 1L, the hard mask layer 118 has been removed. The hard mask layer 118 can be removed with an etching process such as a wet etch or a dry etch. Because the hard mask layer 118 is selectively etchable with respect to the hard mask material 124, the hard mask material 124 remains after removal of the hard mask layer 118. In particular, the hard mask material 124 remains as columns positioned on the semiconductor nanostructures 122. The top view of FIG. 1M illustrates that the spacers 126 laterally surrounds the hard mask material 124.

After removal of the hard mask layer 118, spacers 126 are formed on sidewalls of the hard mask material 124. The spacers 126 can include SiO2, SiN, SiCN, SiOC, SiOCN, or other suitable materials. The spacers 126 can be formed by conformally depositing a spacer layer on the integrated circuit 100 and then performing an anisotropic etching process for a duration that results in removal of the spacer layer 126 from the top surfaces of the hard mask material 124 and from portions of the surface of the fourth semiconductor layer 116 where the vertical thickness is smallest. The spacers 126 remain on the sidewalls of the hard mask material 124 due to the larger vertical thickness at those locations. The hard mask material can be deposited by CVD, PVD, ALD, or other suitable processes.

Figures 1N, 1O:
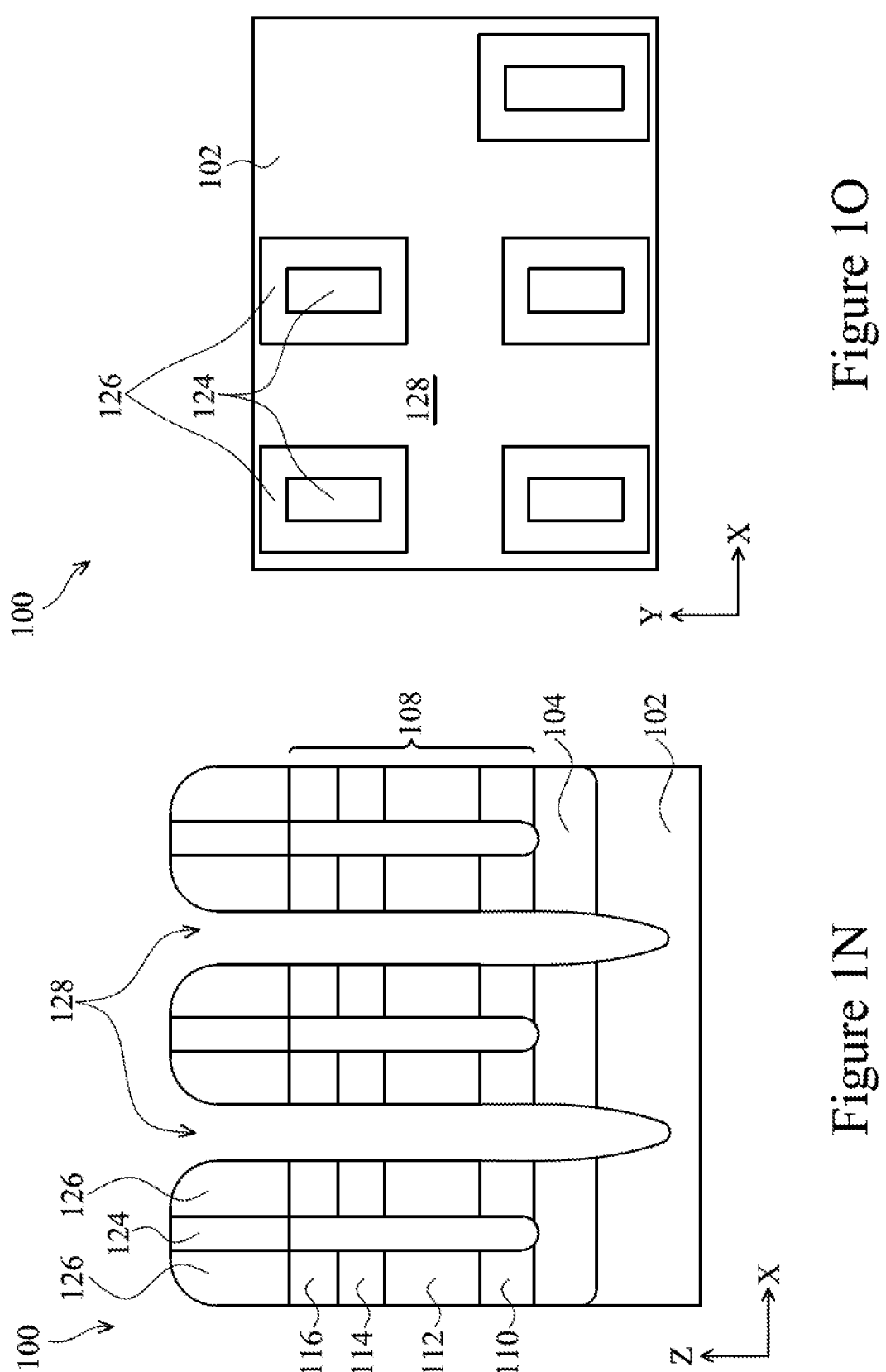

FIG. 1N is a cross-sectional view of the integrated circuit 100 at an intermediate stage of processing, in accordance with some embodiments. FIG. 1O is a top view of the integrated circuit 100 at the stage of processing of FIG. 1N, in accordance with some embodiments. An etching process has been performed to form trenches 128 through the layers of the semiconductor stack 108, the source/drain region 104, and partially into the substrate 102. The etching process forms the trenches 128 at all regions that are not directly below the spacers 126 and the hard mask material 124. As will be set forth in more detail below, the trenches 128 are utilized to form the shallow trench isolation (STI) regions. The etching process to form the trenches 128 can include a single etching step or a plurality of etching steps. The etching process can include wet etches, dry etches, or other types of etching processes. The etching process expose the semiconductor substrate 102. The trenches 128 may extend into the substrate 102 between 10 nm and 20 nm, in accordance with some embodiments, though other depths can be utilized without departing from the scope of the present disclosure.

Figures 1P, 1Q:
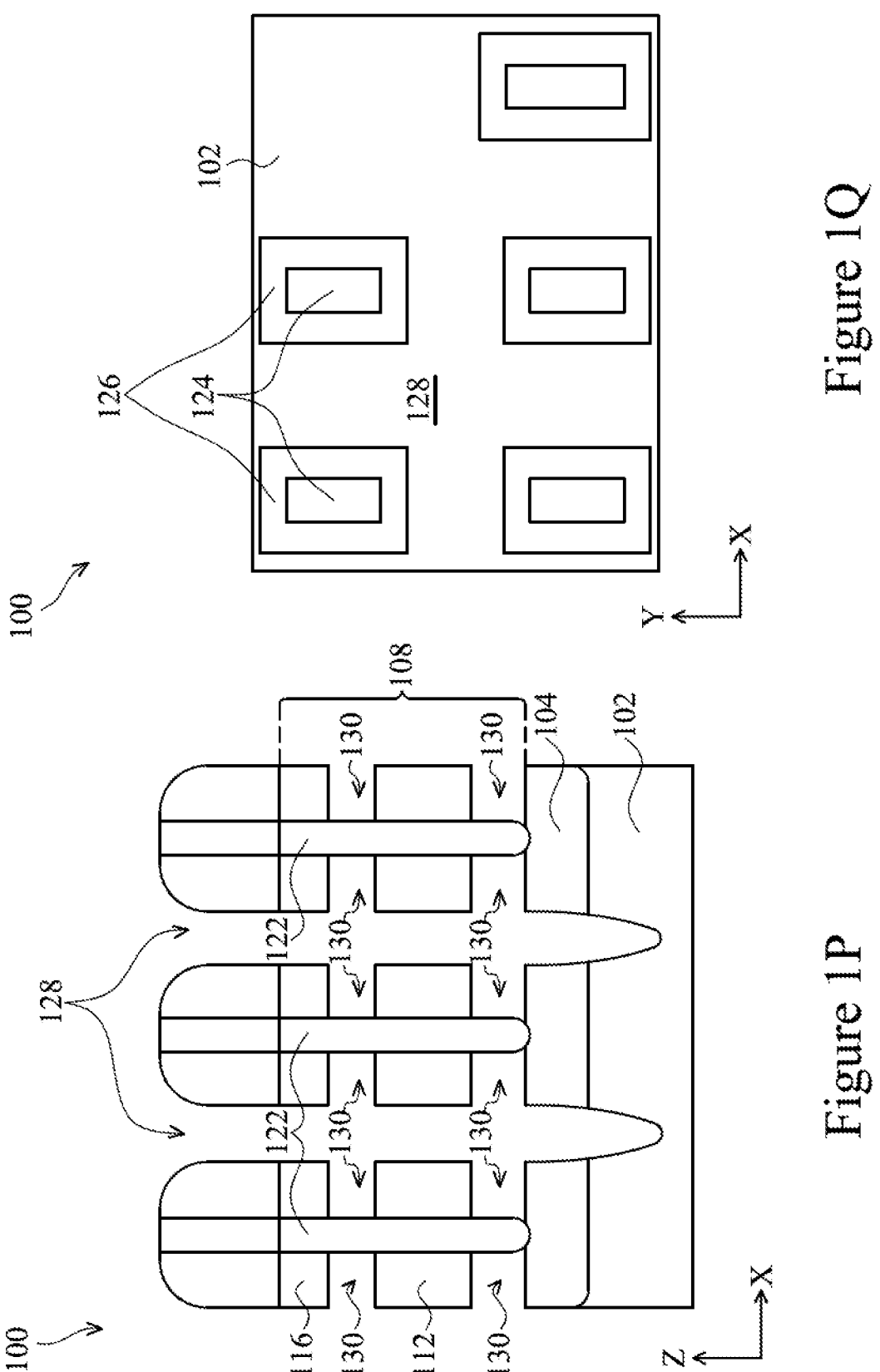

FIG. 1P is a cross-sectional view of the integrated circuit 100 at an intermediate stage of processing, in accordance with some embodiments. FIG. 1Q is a top view of the integrated circuit 100 at the stage of processing of FIG. 1P, in accordance with some embodiments. Recesses 130 have been formed. In particular, an etching process has been performed that selectively etches the first semiconductor layer 110 and the third semiconductor layer 114 with respect to the second semiconductor layer 112, the fourth semiconductor layer 116, the source/drain region 104, and the semiconductor substrate 102. This illustrates one of the benefits of having the third and first semiconductor layers 110 and 114 selectively etchable with respect to the other semiconductor layers. Very precise recesses 130 are formed in place of the first semiconductor layer 110 and the third semiconductor layer 114. The recesses 130 expose portions of the semiconductor nanostructures 122. The recesses 130 are not apparent in the top view of FIG. 1Q.

Figures 1R, 1S:
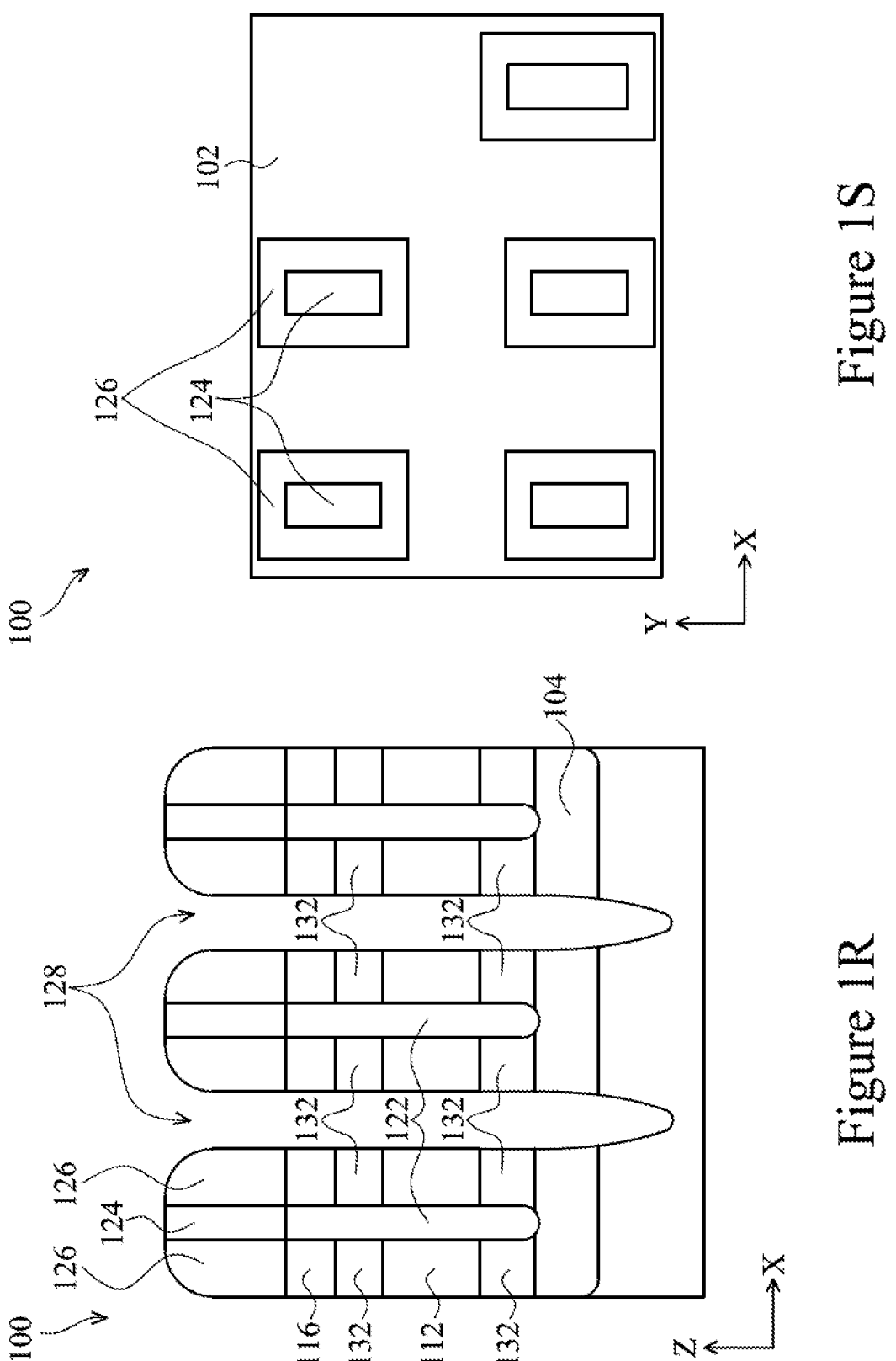

FIG. 1R is a cross-sectional view of the integrated circuit 100 at an intermediate stage of processing, in accordance with some embodiments. FIG. 1S is a top view of the integrated circuit 100 at the stage of processing of FIG. 1R, in accordance with some embodiments. The inner spacers 132 have been formed in the recesses 130. As will be set forth in more detail below, the inner spacers 132 serve to electrically isolate the semiconductor nanostructures 122 and the source/drain regions 104 from the gate metals that will be deposited subsequently.

The spacer (e.g. inner spacers 132) can be formed by depositing a dielectric material in the recesses 130 and the trenches 128. After deposition of the dielectric material, an anisotropic etching process is performed to remove the dielectric material from all locations that are not directly below the spacers 126 and the hard mask material 124. The dielectric material can include a low K dielectric material such as $SiO_2$, SiN, SiCN, SiOC, SiOCN, or other suitable dielectric materials. While FIG. 1R illustrates substantially vertical sidewalls of the spacers 132, in practice, the inner spacers 132 may have concave sidewalls that is recess 115 (see FIG. 4). The dielectric material of the inner spacers 132 may be deposited by CVD, PVD, ALD, or other suitable deposition processes. The inner spacers 132 are not apparent in the top view of FIG. 1S.

Figures 1T, 1U:
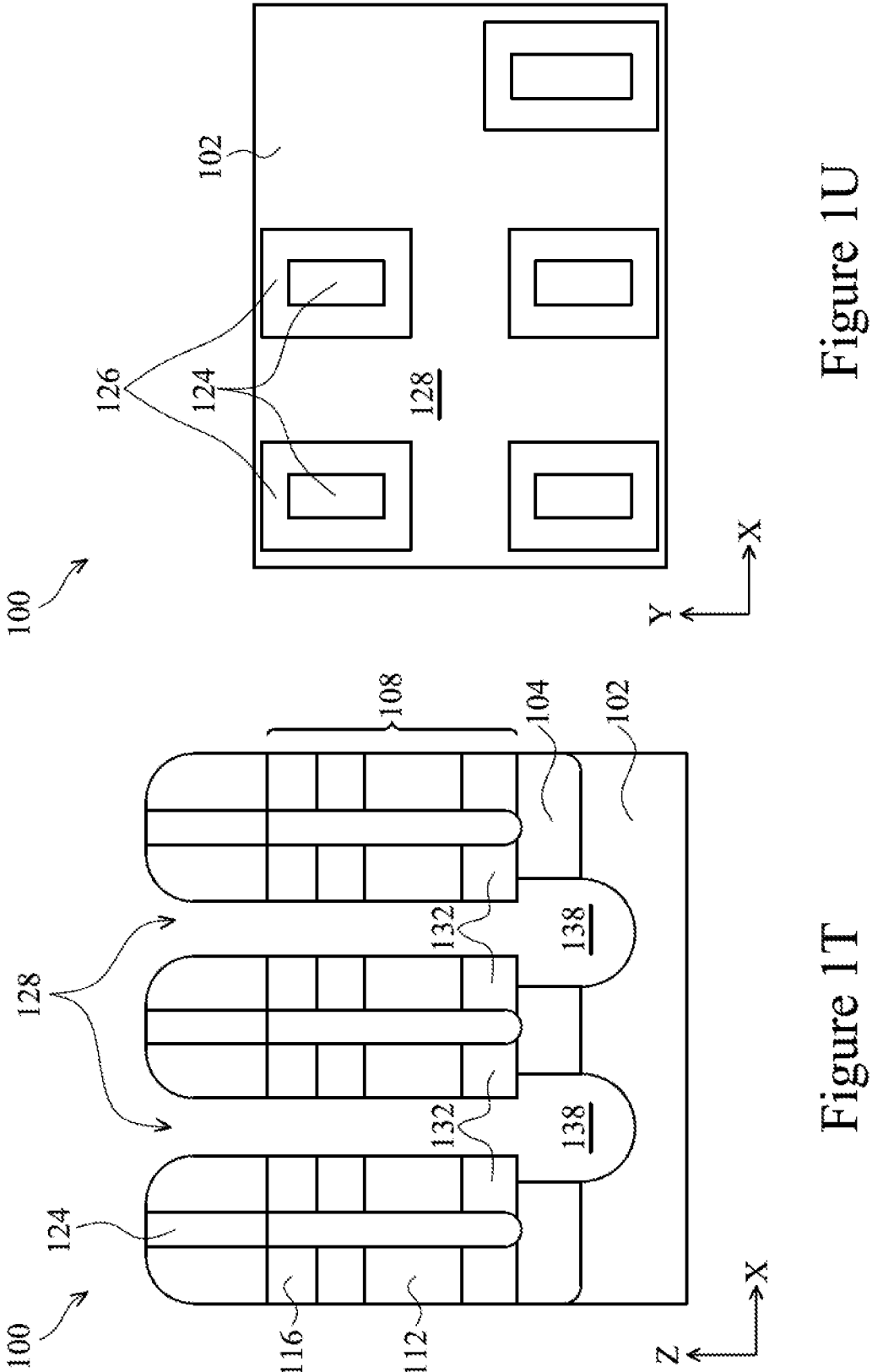

FIG. 1T is a cross-sectional view of the integrated circuit 100 at an intermediate stage of processing, in accordance with some embodiments. FIG. 1U is a top view of the integrated circuit 100 at the stage of processing of FIG. 1T, in accordance with some embodiments. An etching process has been performed to laterally widen the trenches 128 below the stack of semiconductor layers 108. This results in expanded trench regions 134 in the source/drain regions 104 and the substrate 102. In particular, the gaps extend laterally below the inner spacers 132. The expanded trench regions 134 may laterally extend between 3 nm and 7 nm below the inner spacers 132, though other dimensions can be utilized without departing from the scope of the present disclosure.

The etching process selectively etches the material of the substrate 102 and the source/drain regions 104 with respect to the second semiconductor layer 112 and the inner spacers 132. Though not shown in FIGS. 1T and 1U, prior to the etching process, a cap layer has been formed on the side-walls of the fourth semiconductor layer 116 to prevent etching of the fourth semiconductor layer 116 due the fact that, in some embodiments, the material of the fourth semiconductor layer 116 is the same as the material of the substrate 102. This could result in undesired etching of the semiconductor layer 116 at this stage of processing. The cap layer may be formed by forming a blocking structure in the trenches 128, etching back the blocking structure to expose the sidewalls of the fourth semiconductor layer 116, and oxidizing the exposed sidewall to form the cap layer. Alternatively, the cap layer can be formed by selectively depositing an oxide or nitride layer on the sidewall of the cap layer.

Figures 1V, 1W:
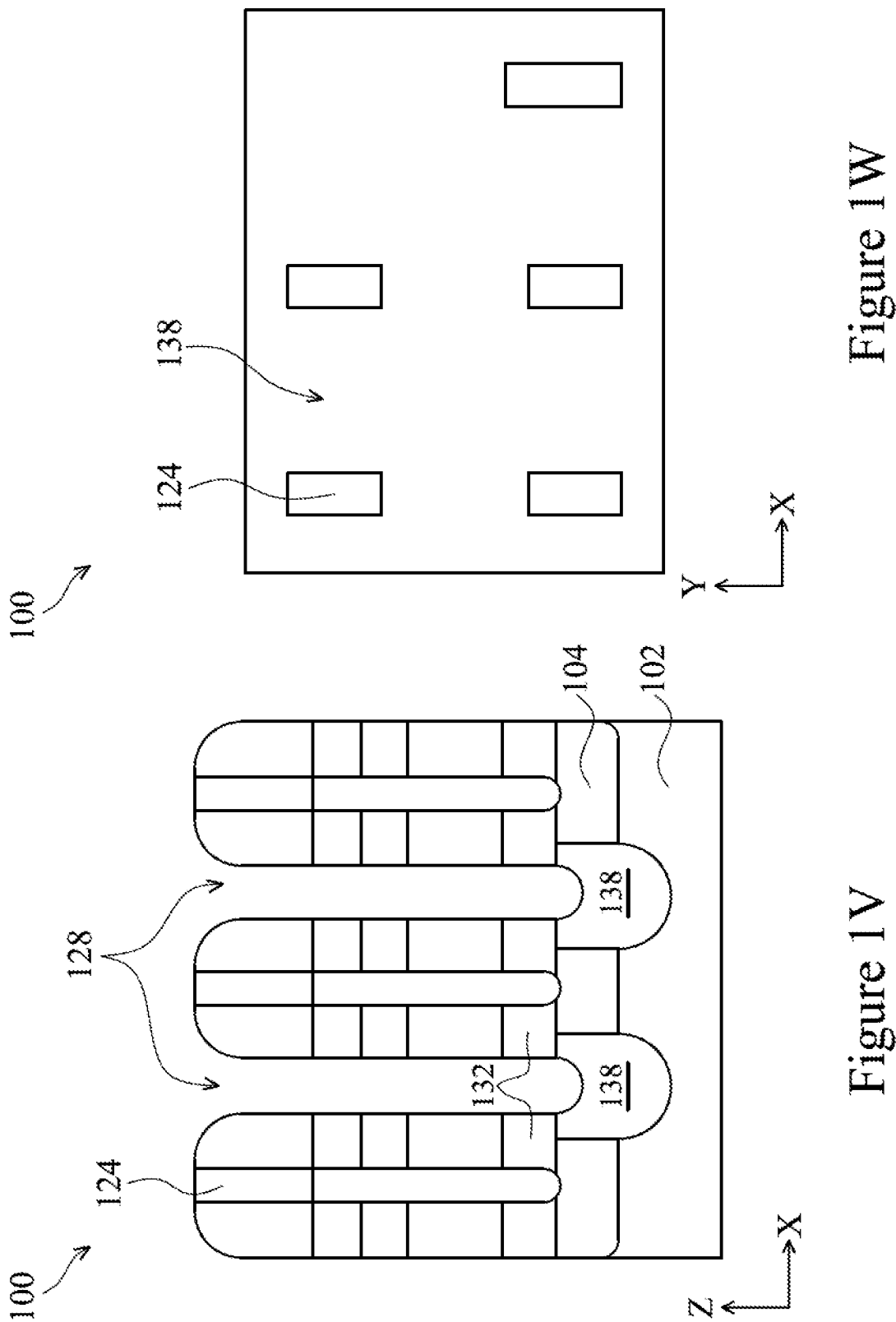

FIG. 1V is a cross-sectional view of the integrated circuit 100 at an intermediate stage of processing, in accordance with some embodiments. FIG. 1W is a top view of the integrated circuit 100 at the stage of processing of FIG. 1V, in accordance with some embodiments. The shallow trench isolation regions 138 have been formed in the expanded trench regions 134, in accordance with some embodiments. The shallow trench isolation regions 138 can be formed by depositing a dielectric material in the trenches 128 and on exposed surfaces of the integrated circuit 100. A CMP process can then be performed to remove the dielectric material above the hard mask material 124 and the spacers 126. An etching process can then be performed to etch back the dielectric material to the level shown in FIG. 1V. The shallow trench isolation region can include silicon oxide, silicon nitride, or other suitable dielectric materials. Although FIG. 1V illustrates that the surface of the shallow trench isolation regions 138 is below the bottom surface of the inner spacers 132, in practice, the top surface of the shallow trench isolation region 138 may extend in the trench 128 higher than the bottom surface of the lower inner spacers 132. Other processes and materials can be utilized for the shallow trench isolation regions 138 without departing from the scope of the present disclosure.

Figures 1X, 1Y:
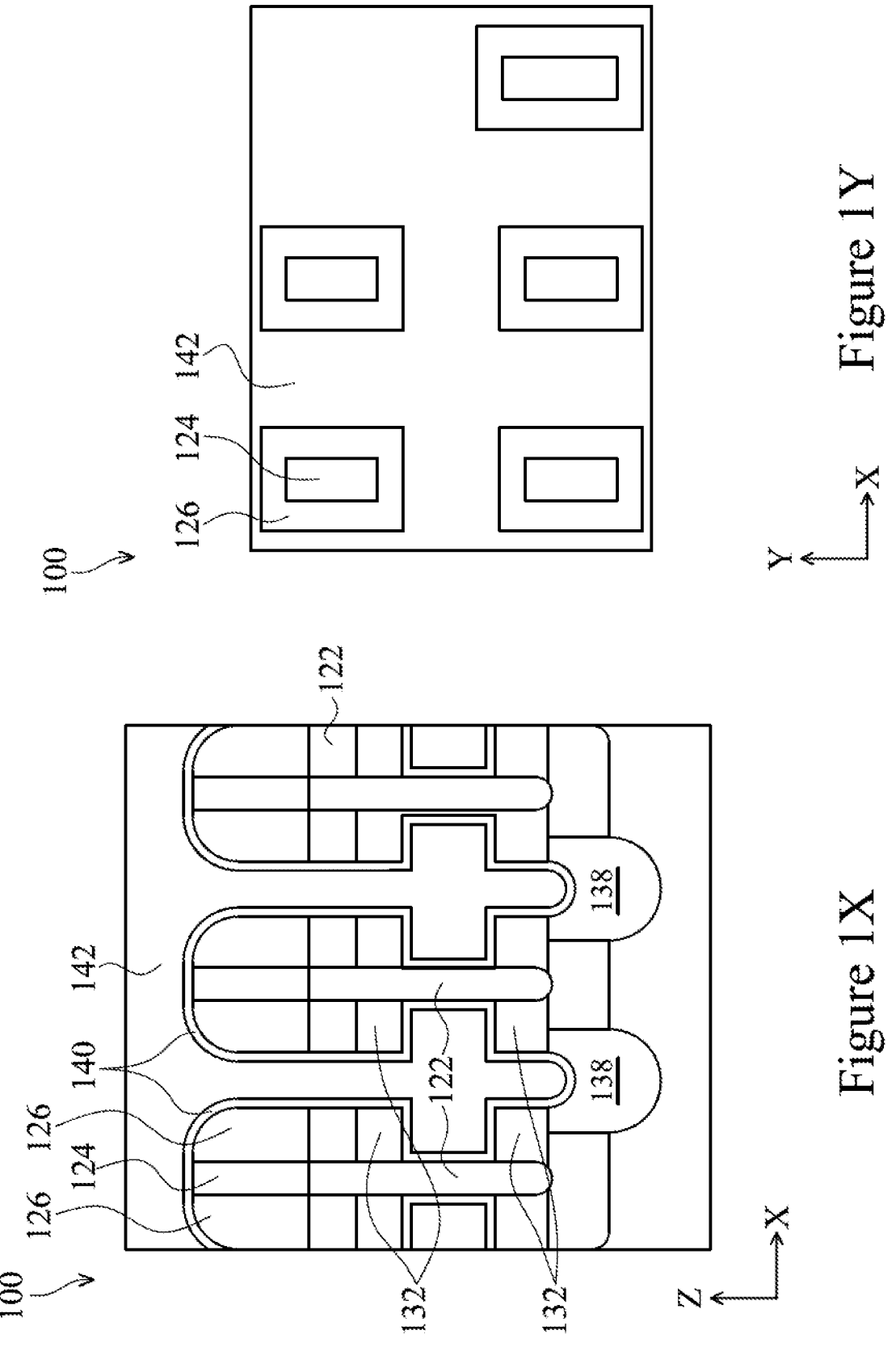

FIG. 1X is a cross-sectional view of the integrated circuit 100 at an intermediate stage of processing, in accordance with some embodiments. FIG. 1Y is a top view of the integrated circuit 100 at the stage of processing of FIG. 1X, in accordance with some embodiments. A gate dielectric 140 has been deposited on exposed portions of the inner spacers 132, the semiconductor layer 116, the semiconductor nano-structures 122, the spacers 126, and the hard mask material 124.

Although a single gate dielectric layer 140 is shown, in practice, the gate dielectric layer 140 can include an inter-facial gate dielectric layer and a high K gate dielectric layer. The interfacial gate dielectric layer is on the surfaces of the semiconductor nanostructures 122 and on other surfaces. The interfacial gate dielectric layer is deposited on all exposed surfaces of the semiconductor nanostructures 122. The interfacial gate dielectric layer laterally surrounds the semiconductor nanostructures 122. The interfacial gate dielectric layer can include a dielectric material such as silicon oxide, silicon nitride, or other suitable dielectric materials. The interfacial gate dielectric layer can include a comparatively low-K dielectric with respect to high-K dielectric such as hafnium oxide or other high-K dielectric materials that may be used in gate dielectrics of transistors. High-K dielectrics can include dielectric materials with a dielectric constant higher than the dielectric constant of silicon oxide. The interfacial gate dielectric layer can be formed by a thermal oxidation process, a chemical vapor deposition (CVD) process, or an atomic layer deposition (ALD) process. The interfacial gate dielectric layer can have a thickness between 0.5 nm and 2 nm. Other materials, deposition processes, and thicknesses can be utilized for the interfacial gate dielectric layer without departing from the scope of the present disclosure.

The high-K gate dielectric layer of the gate dielectric 140 is deposited in a conformal deposition process. The conformal deposition process deposits the high-K dielectric layer on the interfacial gate dielectric layer, the inner spacers 132, the spacers 126, the hard mask material 124, and the shallow trench isolation region 138. The high-K gate dielectric layer surrounds the semiconductor nanostructures 122. The high-K gate dielectric layer has a thickness between 1 nm and 3 nm. The high-K dielectric layer includes one or more layers of a dielectric material, such as $HfO_2$, HfSiO, HfSION, HfTaO, HfTIO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The high-K dielectric layer may be formed by CVD, ALD, or any suitable method. Other thicknesses, deposition processes, and materials can be utilized for the high-K dielectric layer without departing from the scope of the present disclosure.

A gate metal 142 has been deposited. The gate metal 142 is deposited on all exposed surfaces of the high-K dielectric layer. The gate metal 142 substantially surrounds semiconductor nanostructures 122. Although the gate metal 142 is shown as a single layer in FIGS. 1X and 1Y, in practice, the gate metal 142 can include one or more conductive liner layers, work function layers, and gate fill layers that collectively make up the gate metal. The gate metal can include one or more of Ti, TiN, Ta, TaN, Al, Cu, Co, Ru, W, Au, or other suitable conductive materials. The gate metal 142 can be deposited by PVD, ALD, or CVD. Other configurations, materials, and deposition processes can be utilized for the gate metal 142 without departing from the scope of the present disclosure. The lateral expansion of the shallow trench isolation regions 138 can assist in preventing short circuiting between the gate metal 142 and the source/drain regions 104.

Figures 1Z, 2A:
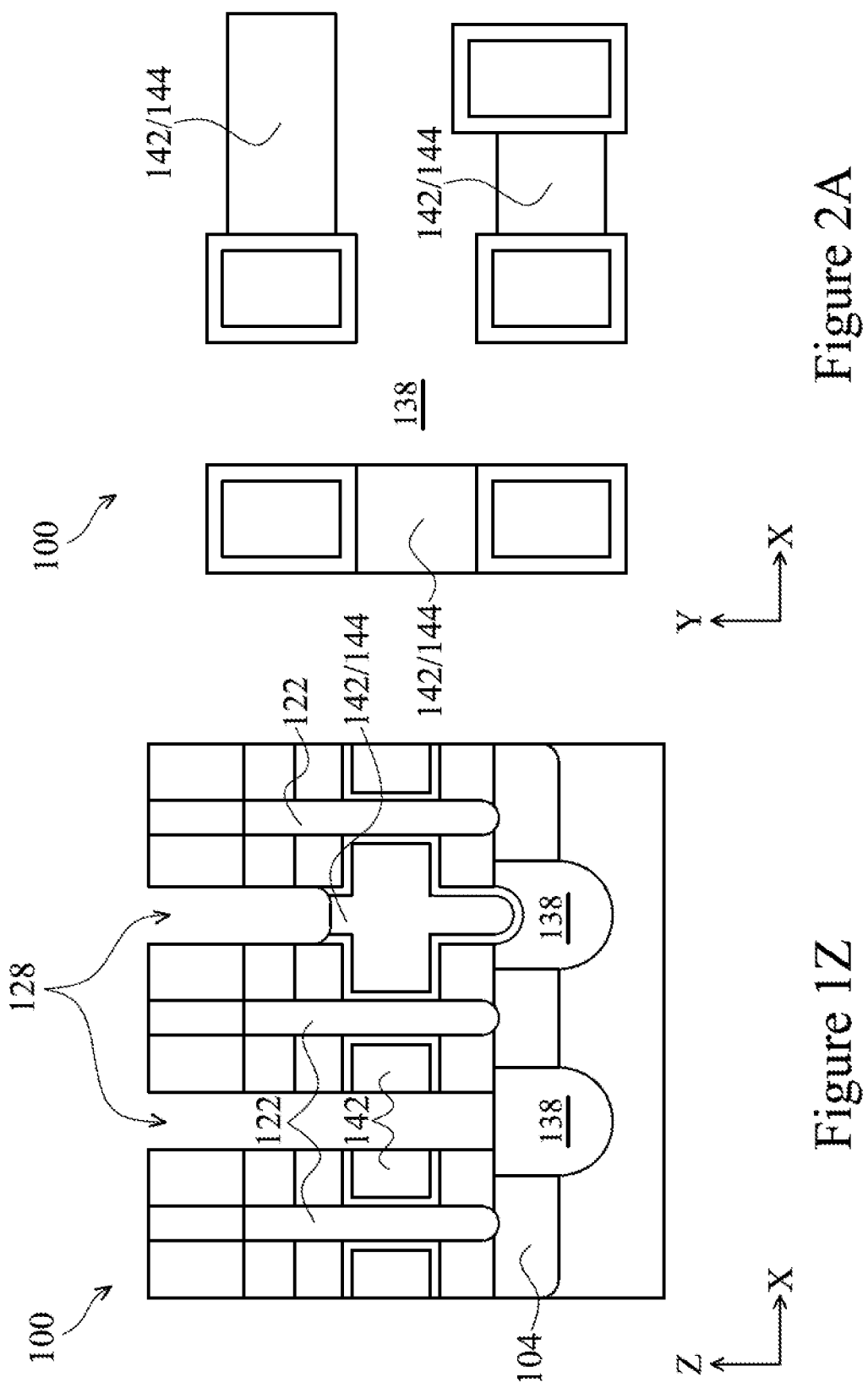

FIG. 1Z is a cross-sectional view of the integrated circuit 100 at an intermediate stage of processing, in accordance with some embodiments. FIG. 2A is a top view of the integrated circuit 100 at the stage of processing of FIG. 1Z, in accordance with some embodiments. An etchback process has been performed to reduce the height of the gate metal 142 within the trenches 128. In the initial etchback process, no mask is present and the gate metal 142 is recessed to the location shown above the right trench 128.

In the example of FIG. 1Z, three vertical transistors will eventually be formed, one for each semiconductor nano-structure 122. The gate metal 142 wraps laterally around each semiconductor nanostructure 122, in a gate all around configuration. In the example of FIG. 1Z, the gate metal 142 of the left transistor is to be electrically isolated from the gate metal 142 of the center transistor and the right transistors. The gate metal of the center transistor and the right transistor are to be shorted together.

Accordingly, after the etchback process, a hard mask layer is formed (not shown) and patterned. In particular, the hard mask is patterned to cover the right trench 128 and to expose the left trench 128. An anisotropic etching process is then performed to selectively etch the gate metal 142 in the downward direction. This corresponds to a cut gate process in which the gate metal 142 is cut to isolate the gate electrodes of selected transistors. In the example of FIG. 1Z, the gate metal 142 that surrounds the left nanostructure 122 is cut and electrically isolated from the gate metal 142 the wraps around the sensor semiconductor nanostructure 122. The gate metal 142 that surrounds the center nanostructure 122 and the right nanostructure 122 is not cut. The hard mask layer is then removed. The result is that gate interconnects 144, made up of the gate metal 142, electrically connect the gate electrodes of the center and right transistors. Gate electrodes in other regions may be connected through interconnect structures such as metal interconnects formed above the transistors and conductive vias. This process results in fewer conductive vias in the metal layers. This can result in the size of the layout being reduced. The gate cut process may also etch into the shallow trench isolation regions 138 between 0 nm and 20 nm.

Figures 2B, 2C:
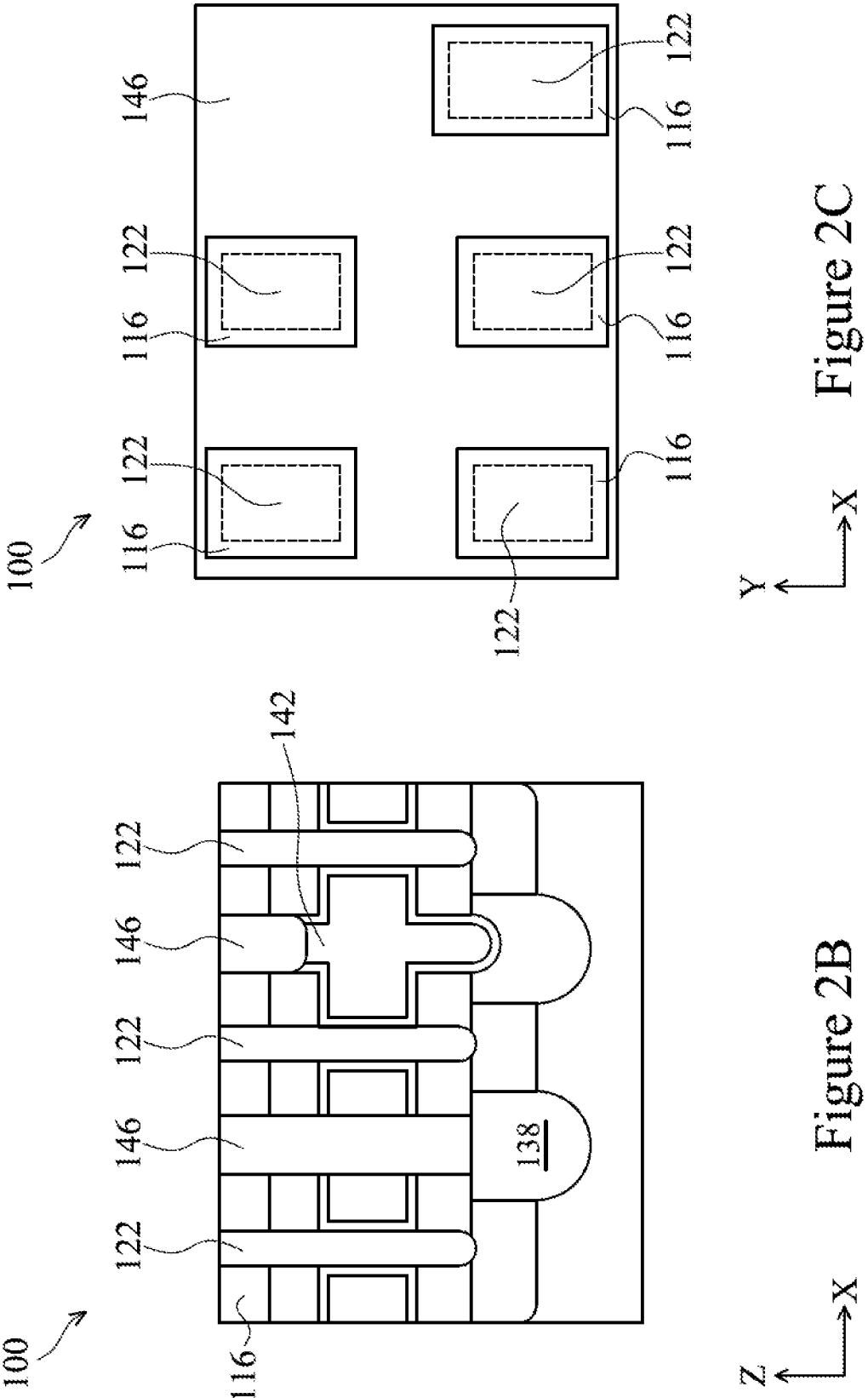

FIG. 2B is a cross-sectional view of the integrated circuit 100 at an intermediate stage of processing, in accordance with some embodiments. FIG. 2C is a top view of the integrated circuit 100 at the stage of processing of FIG. 2B, in accordance with some embodiments. An interlevel dielectric layer 146 has been deposited. The interlevel dielectric layer 146 fills the remaining portions of the trenches 128. In the left trench 128, the interlevel dielectric layer 146 contacts the shallow trench isolation region 138. In the right trench 128, the interlevel dielectric layer 146 contacts the gate metal 142. The interlevel dielectric layer can include silicon oxide, silicon nitride, or other suitable dielectric layers. The interlevel dielectric layer 146 can be formed via CVD, PVD, ALD, or other suitable deposition processes. The interlevel dielectric layer 146 may correspond to a first interlevel dielectric layer 146.

In some embodiments, prior to deposition of the interlevel dielectric layer 146, a gate insulation material may be deposited. The gate insulation material can include silicon oxide, silicon nitride, SiCN, SiCON, SiCO, or other suitable dielectric materials. The interlevel dielectric layer 146 may then be deposited subsequently. The material of the gate insulation material may be different than the material of the interlevel dielectric layer 146.

After deposition of the interlevel dielectric layer 146, a CMP process is performed. The CMP process entirely removes the spacers 126 and the hard mask material 124 and exposes the top surfaces of the semiconductor nanostructures 122 and the fourth semiconductor layer 116.

Figures 2D, 2E:
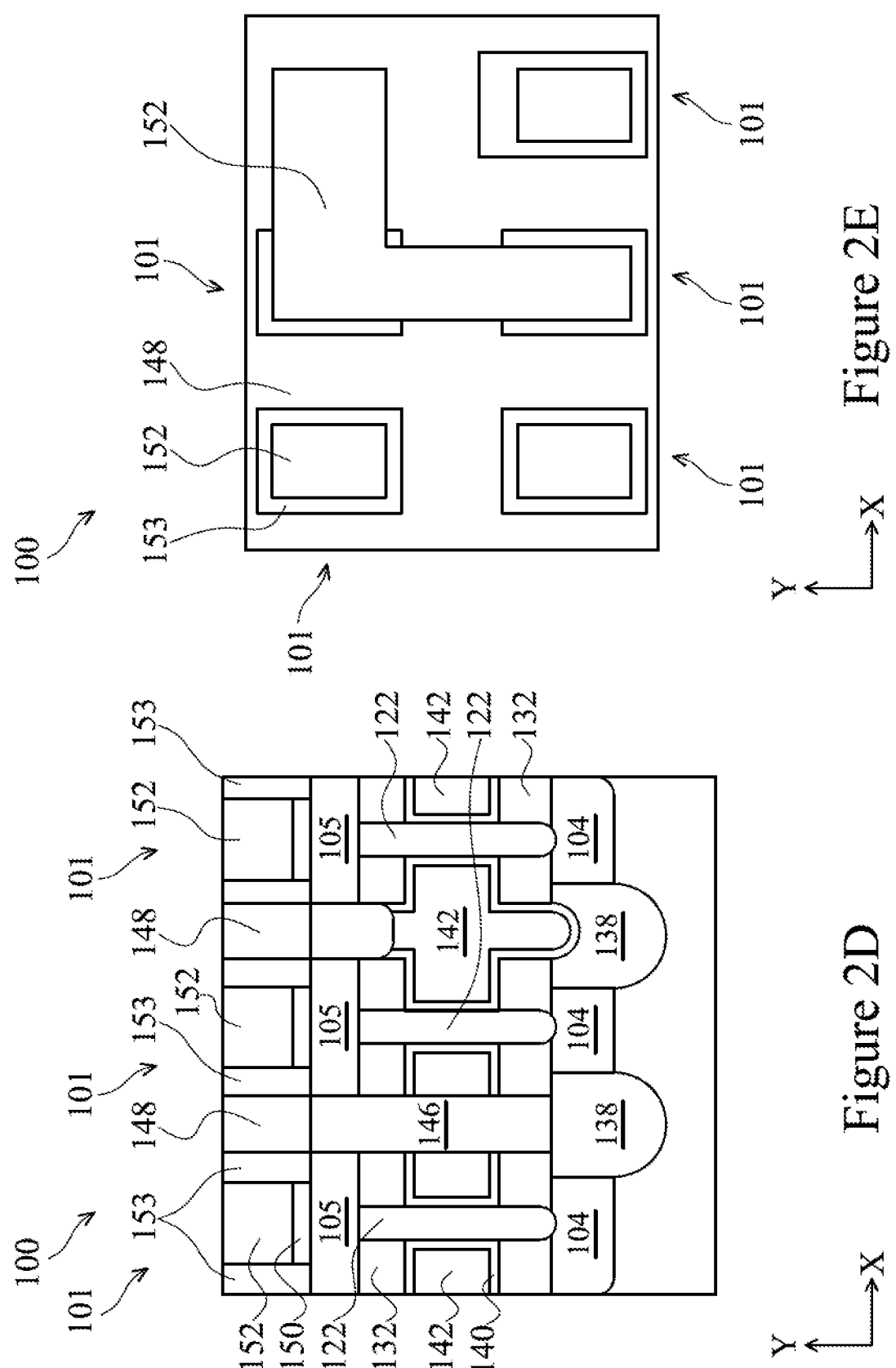

FIG. 2D is a cross-sectional view of the integrated circuit 100 at an intermediate stage of processing, in accordance with some embodiments. FIG. 2E is a top view of the integrated circuit 100 at the stage of processing of FIG. 2D, in accordance with some embodiments. An etchback process has been performed to remove the fourth semiconductor layer 116 and to etchback the semiconductor nanostructures 122 to a level substantially even with a top surface of the upper inner spacers 132. Upper source/drain regions 105 are then formed on the top surface of the upper inner spacers 132 and in contact with the top surface of the semiconductor nanostructures 122. The upper source/drain regions 105 can include silicon, silicon germanium, or other suitable semiconductor materials. The source/drain regions 105 can be formed by an epitaxial growth from the semiconductor nanostructures 122. The doping of the source/drain regions 105 can be accomplished in situ.

After formation of the upper source/drain regions 105, a dielectric layer 148 is deposited on the upper source/drain regions 105 and on the interlevel dielectric layer 146. The dielectric layer 148 can include silicon oxide, silicon nitride, SiCN, SiCON, SiCO, or other suitable dielectric materials. The dielectric layer 148 can be deposited by CVD, PVD, ALD, or other suitable deposition processes. The dielectric layer 148 may correspond to a second interlevel dielectric layer above the first interlevel dielectric layer 146.

The dielectric layer 148 is then patterned to expose portions of the upper source/drain regions 105. As can be seen in FIG. 2E, the patterning of the dielectric layer 148 may also form connections between adjacent upper source/drain regions 105. The patterning of the dielectric layer 148 can be accomplished by photolithography processes.

After patterning of the dielectric layer 148, a silicide layer 150 is formed in contact with the source/drain regions 105. The silicide layer 150 can include nickel silicide, titanium silicide, or other types of silicide.

After formation of the silicide layer 150, a source/drain metal 152 is deposited in contact with the silicide layer 150. The source/drain metal 152 can include one or more of titanium, tantalum, tungsten, copper, aluminum, tantalum nitride, titanium nitride, or other suitable conductive materials. The integrated circuit may also include source/drain metal liners 153 laterally surrounding the source/drain metal 152. The source/drain metal liners 153 can include titanium nitride, tantalum nitride, or other suitable conductive materials. As can be seen in FIG. 2E, the source/drain metal 152 can interconnect the source/drain regions 105 of some adjacent transistors. The source/drain metal 152, the silicide 150, and the liner 153 may collectively correspond to a source/drain contact.

In FIGS. 2D and 2E, front end processing is substantially complete and transistors 101 have been formed. FIG. 2D illustrates three vertical nanostructure transistors 101. FIG. 2E illustrates five vertical nanostructure transistors 101. Each transistor 101 includes a semiconductor nanostructure 122 extending between a lower source/drain region 104 and an upper source/drain region 105. The semiconductor nanostructure 122 corresponds to a channel region of the transistor 101. Each transistor includes a gate metal 142 that laterally wraps around the semiconductor nanostructure 122 and that is separated from the semiconductor nanostructure 122 by the gate dielectric 140. Each transistor includes inner spacers 132 that electrically isolate the gate metal 142 from the upper and lower source/drain regions 104 and 105. Each transistor 101 includes a source/drain metal 152 by which voltages can be applied to the source/drain regions 105. Though not shown in FIG. 2D, gate metal contacts may be formed to connect to the gate metals 142 in order to apply voltages to the gate metal 142 of each transistor 101.

The design of the source/drain metals 152 may provide a higher degree of freedom without utilization of additional vias. If the source/drain metal 152 is formed in the same level as the gate metal 142, the connection of the source/drain metals 152 may be blocked by the gate metal 142 and may need additional conductive vias to metal interconnect layers above in order to connect source/drain metals 152 in different regions. Accordingly, the formation of the source/drain metals 152 in the second interlevel dielectric layer 148 above the first interlevel dielectric layer 146, while the gate metal 142 is formed in the first interlevel dielectric layer 146, enables more compact layouts without the risk of undesired short circuits and complex interconnections design.

Figure 2F:
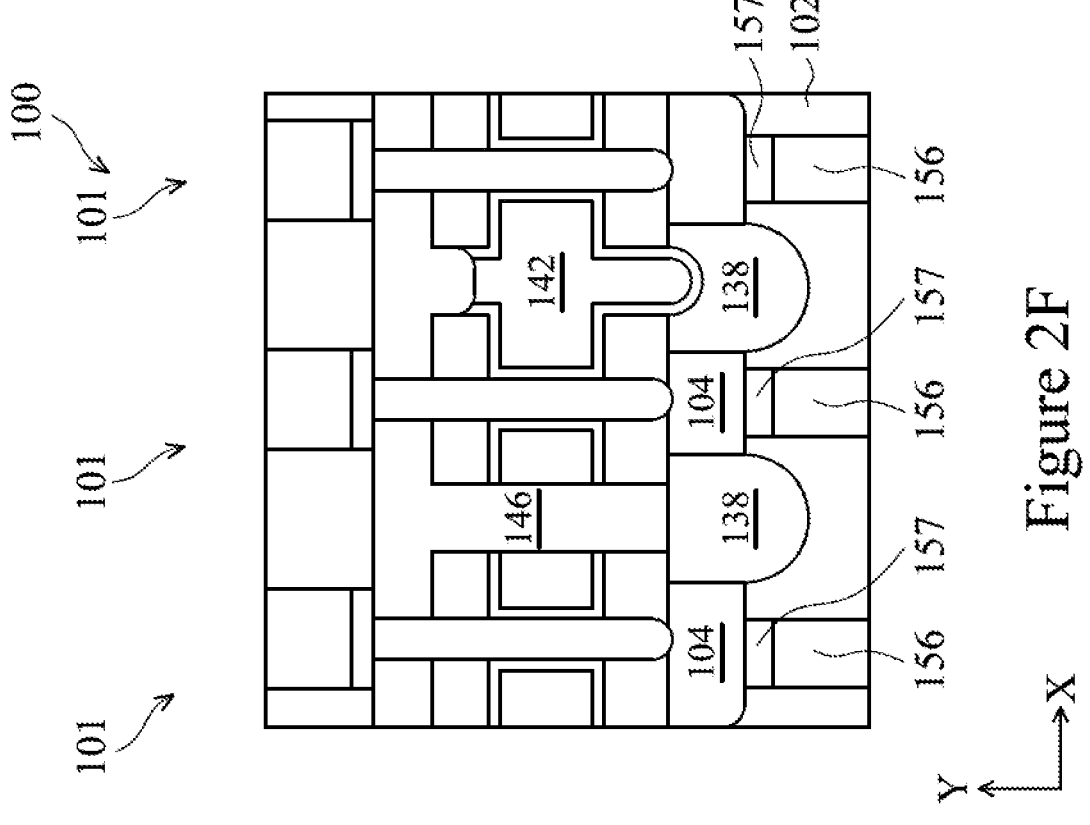

FIG. 2F illustrates backside source/drain contacts, according to some embodiments. In particular, after front end processing is complete, the integrated circuit (i.e., the wafer prior to dicing) may be flipped such that the bottom of the substrate 102 is exposed. Trenches can be etched through the substrate 102 to expose the bottom of the source/drain regions 104. A silicide layer 157 may be formed in contact with the source/drain region 104. The silicide layer 157 may be substantially similar to the silicide layer 150.

After formation of the silicide layer 157, a source/drain metal 156 is deposited in contact with the silicide layer 157. The source/drain metal 156 can include one or more of titanium, tantalum, tungsten, copper, aluminum, tantalum nitride, titanium nitride, or other suitable conductive materials. The integrated circuit may also include source/drain metal liners (not shown) laterally surrounding the source/drain metal 152. The source/drain metal liners can include titanium nitride, tantalum nitride, or other suitable conductive materials. The source/drain metal 156, the silicide 157, and the liner may collectively correspond to a source/drain contact.

Various other processes and configurations can be utilized for formation of the vertical nanostructure transistors 101. The structures and processes shown and described in relation to FIGS. 1A-2E are given by way of example and other structures, processes, and configurations can be utilized without departing from the scope of the present disclosure.

Figures 3A, 3B:
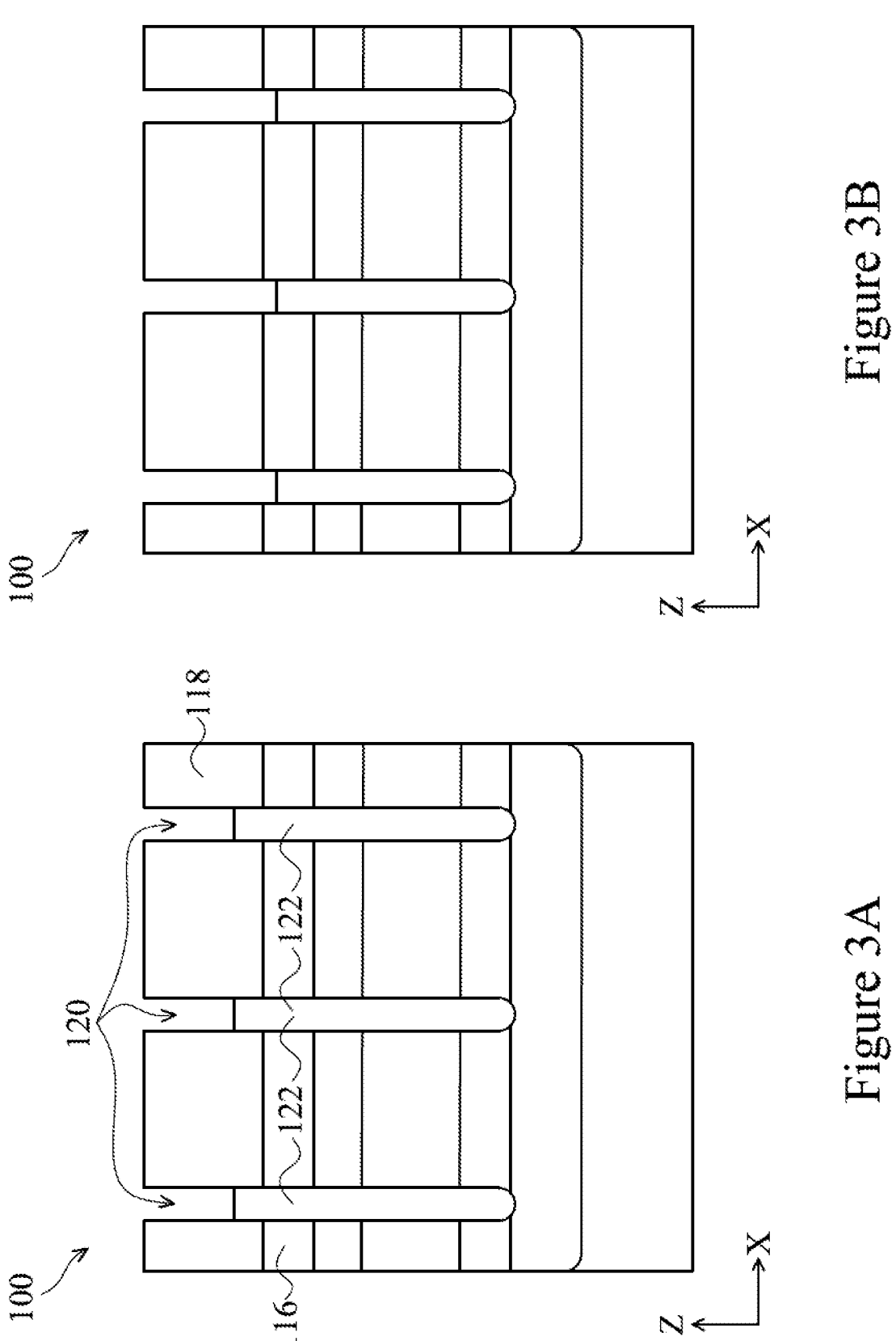
FIGS. 3A, 3B, and 4-15 include cross-sectional and top views of an integrated circuit including some variants of the integrated circuit shown in relation to FIGS. 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, 1X, 1Y, 1Z, 2A, 2B, 2C, 2D, 2E, and 2F, in accordance with some embodiments.

FIG. 3A is a cross-sectional view of the integrated circuit 100 at the stage of processing shown in FIG. 1H, in accordance with some embodiments. FIG. 3A differs from FIG. 1H in that the semiconductor nanostructures 122 have been formed having a top surface higher than the top surface of the fourth semiconductor layer 116. The top surface of the semiconductor nanostructures 122 may be higher than the top surface of the fourth semiconductor layer 116 by between 0 nm and 2 nm, though other dimensions can be utilized without departing from the scope of the present disclosure.

FIG. 3B is a cross-sectional view of the integrated circuit 100 at the stage of processing shown in FIG. 1H, in accordance with some embodiments. FIG. 3B differs from FIG. 1H in that the semiconductor nanostructures 122 have been formed having a top surface lower than the top surface of the fourth semiconductor layer 116. The top surface of the semiconductor nanostructures 122 may be lower than the top surface of the fourth semiconductor layer 116 by between 0 nm and 2 nm, though other dimensions can be utilized without departing from the scope of the present disclosure.

Figure 4:
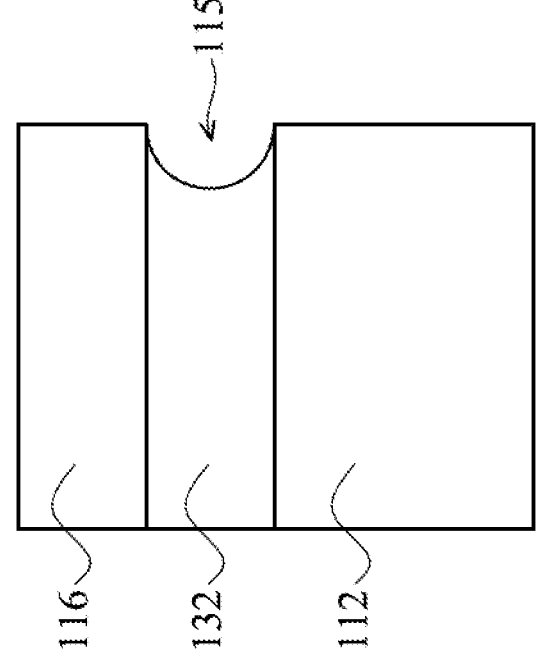

FIG. 4 is an enlarged cross-sectional view of an integrated circuit 100, in accordance with some embodiments. In particular, the view of FIG. 4 is at a stage of processing shown in FIG. 1R. However, in the view of FIG. 4, recesses 115 have been formed in the inner spacers 132. This may result from the etching process that removes dielectric material from the trenches 128 after the deposition process that forms the material of the inner spacers 132. The recesses 115 may form as a result of the etching process not being entirely anisotropic.

Figures 5, 6, 7:
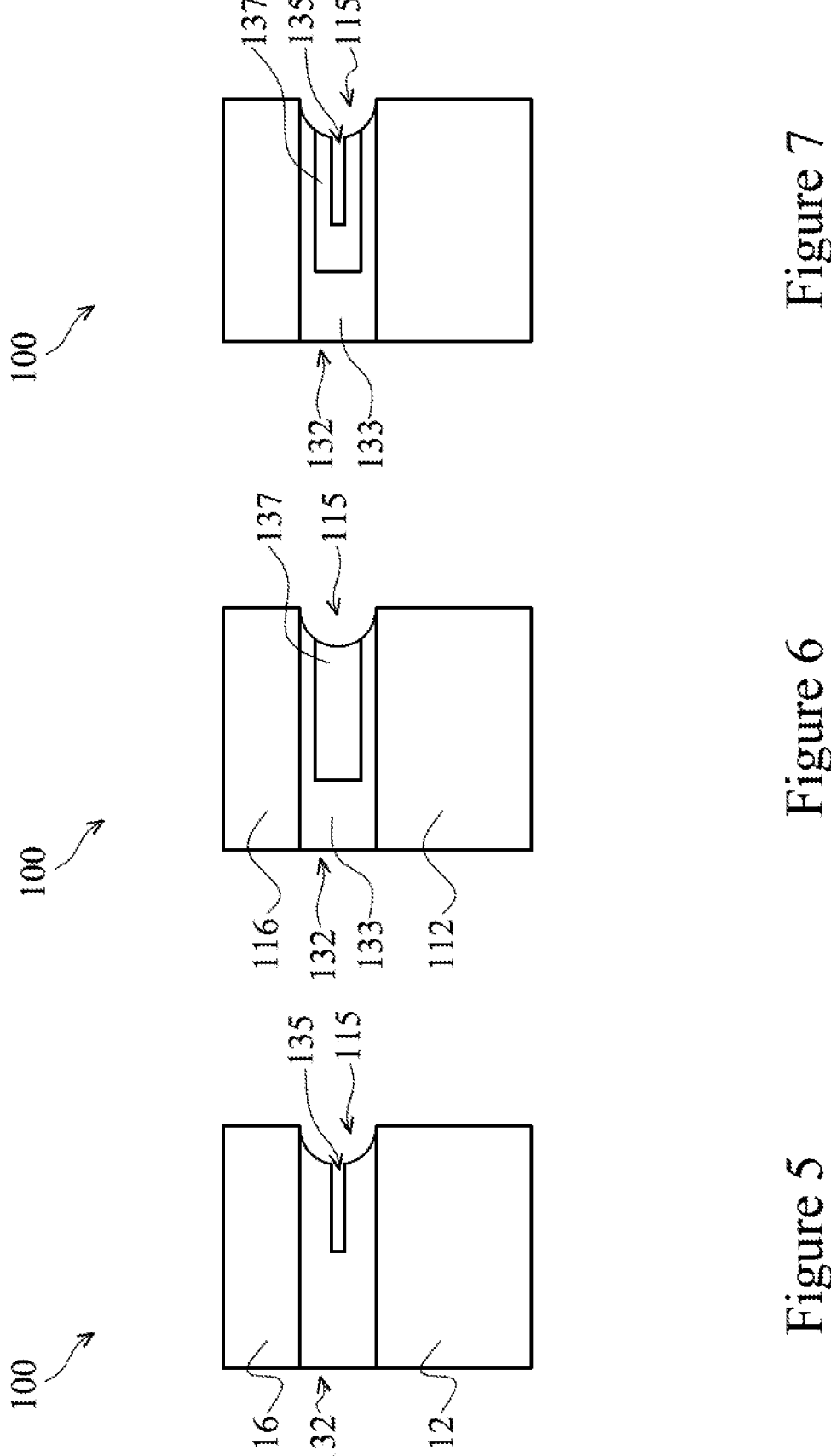

FIG. 5 is an enlarged cross-sectional view of an integrated circuit 100, in accordance with some embodiments. In particular, the view of FIG. 5 is at a stage of processing shown in FIG. 1R. However, in the view of FIG. 5, seams 135 and recesses 115 have been formed in the inner spacers 132. The seams 135 may result when the material of the inner spacer 132 is deposited with a conformal deposition that grows from all exposed surfaces. If the duration of the conformal deposition is carefully selected, then the dielectric material of the inner spacers 132 will not entirely fill the gap between the semiconductor layers 112 and 116. The result is that a seam 135 is formed in the inner spacer 132. The recesses 115 may result as described in relation to FIG. 4. The seams 135 and the recesses 115 may remain after processing is complete. The seams 135 may remain as voids or may be filled with a dielectric material from a subsequent deposition process such as the material of the gate dielectric 140, the material of the interlevel dielectric region 146, or the material of the trench isolation regions 138 in examples in which the top of the trench isolation regions 138 extend higher than the top surface of the source/drain regions 104. The recesses 115 may likewise be filled with dielectric material from the subsequent deposition processes described above in relation to the seams 135.

FIG. 6 is an enlarged cross-sectional view of an integrated circuit 100, in accordance with some embodiments. In particular, the view of FIG. 6 is at a stage of processing shown in FIG. 1R. However, in the view of FIG. 6, the inner spacer 132 is formed of two materials. The first dielectric material 133 is the material deposited to form the inner spacers 132 in FIG. 1R. The deposition of the first material is performed with a conformal deposition process with a duration selected to ensure that the gap between the semiconductor layers 116 and 112 is not entirely filled by the first dielectric material 133. A second dielectric material 137 is then deposited. The second dielectric material 137 fills the remaining space between the first and second semiconductor layers 116 and 112. An etching process may then remove the first and second dielectric materials 133 and 137 from the trenches 128, leaving the inner spacer 132 as shown in FIG. 6. A recess 115 may be formed as described in relation to FIG. 4. The second dielectric material 137 can include one or more of SiO2, SiN, SiCN, SiOC, SiOCN, or other suitable dielectric materials. The second dielectric material 137 may be different than the first dielectric material 133. In one example, the first dielectric material 133 is silicon oxide while the second dielectric material 137 silicon nitride. Other materials may be utilized without departing from the scope of the present disclosure.

FIG. 7 is an enlarged cross-sectional view of an integrated circuit 100, in accordance with some embodiments. In particular, the view of FIG. 7 is at a stage of processing shown in FIG. 6. Similar to FIG. 6, the inner spacer 132 of FIG. 7 includes the first dielectric material 133 and the second dielectric material 137. Both the first dielectric material 133 and the second dielectric material 137 are formed with a conformal deposition process. The duration of each deposition process is selected to ensure that a seam 135 remains after deposition of the second dielectric material 137. The result is that a seam 135 remains in the inner spacer 132. A recess 115 may also substantially as described in relation to FIG. 4.

Figures 8, 9:
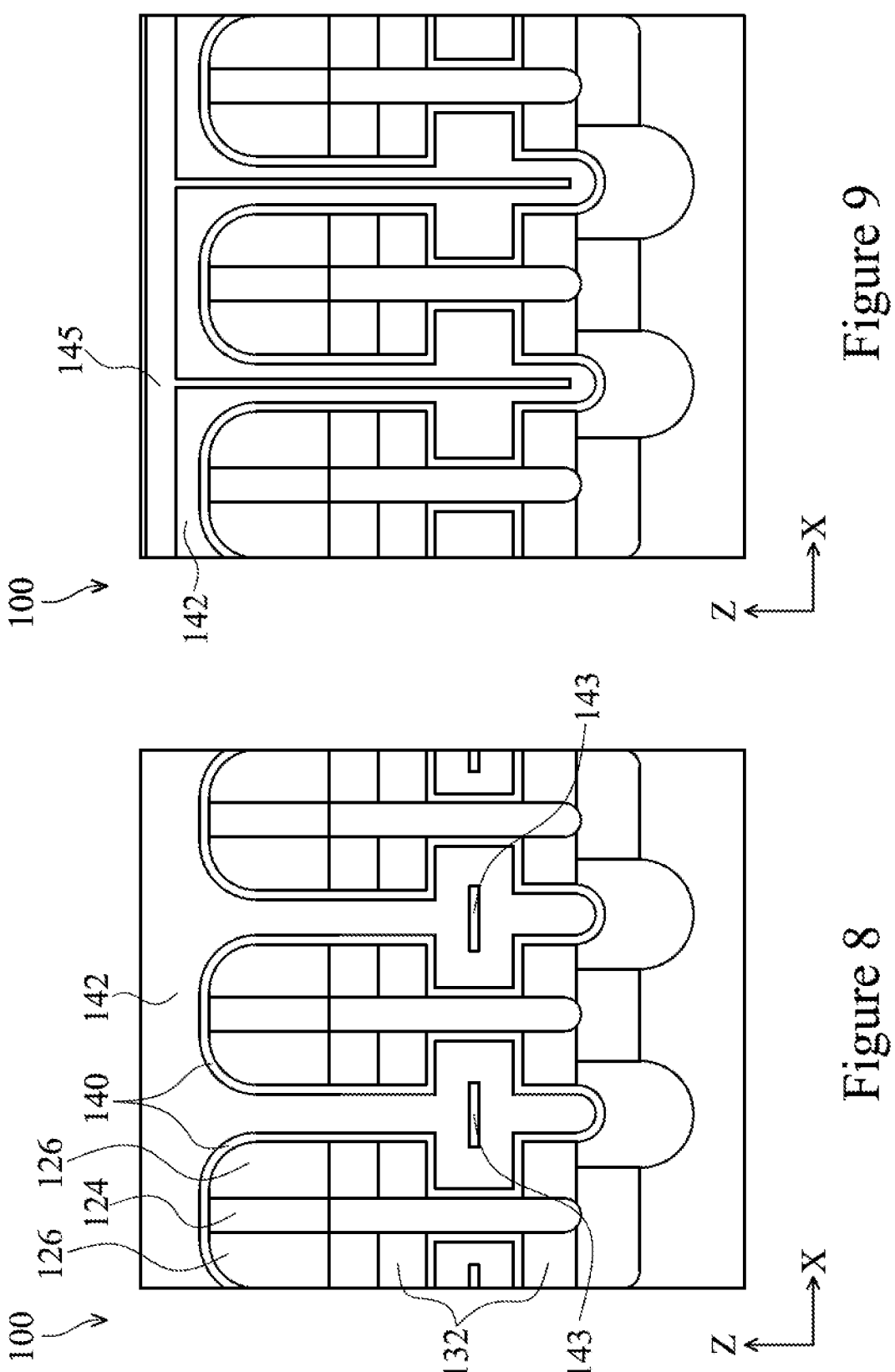

FIG. 8 is a cross-sectional view of an integrated circuit 100, in accordance with some embodiments. In particular, the view of FIG. 8 is at a stage of processing shown in relation to FIG. 1X. However, in FIG. 8, gaps 143 have been formed in the gate metal 142. In particular, the gaps 143 have been formed as a vertical level intermediate to the upper and lower inner spacers 132 and at a lateral location corresponding to the location of the trenches 128. The seams 143 may result in instances in which the gate metal 142 is deposited with a conformal deposition process, such as an ALD process. The conformal growth may result in the upper portions of the trenches 128 entirely filled with the gate metal 142, before the wider portion of the gate metal 142 can be completely filled.

FIG. 9 is a cross-sectional view of an integrated circuit 100, in accordance with some embodiments. In particular, the view of FIG. 9 is at a stage of processing shown in relation to FIG. 1X. However, FIG. 9 illustrates that the gate electrode includes the gate metal 142 and a gate fill material 145. In some embodiments, the initial deposition of the gate metal 142 (which may include multiple layers) does not entirely fill the trenches 128. The gate fill material 145 may then be deposited, filling in remaining spaces in the trenches 128. The gate fill material 145 may include tungsten, or other suitable conductive materials. The gate fill material 145 may be deposited by ALD, PVD, or other suitable deposition processes.

Figure 10:
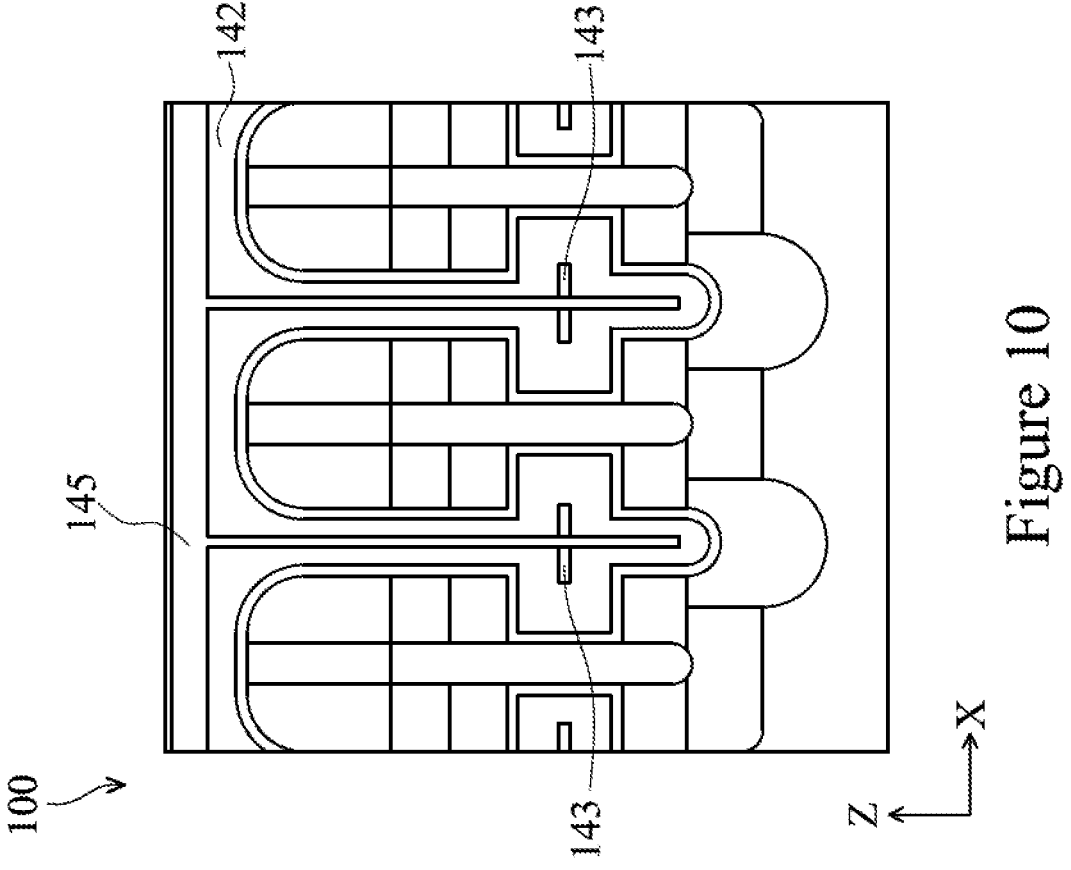

FIG. 10 is a cross-sectional view of an integrated circuit 100, in accordance with some embodiments. In particular, the view of FIG. 1O is at a stage of processing shown in relation to FIG. 9. In FIG. 1O, the gate fill material 145 has been deposited as described in relation to FIG. 9. In FIG. 1O, seams 143, as described in relation to FIG. 8, remain in the gate metal 142. The gate fill material 145 extends downward through the seams 143. The result is that the seams 143 laterally surrounds the downward extending portion of the gate fill material 145.

Figures 11, 12, 13:
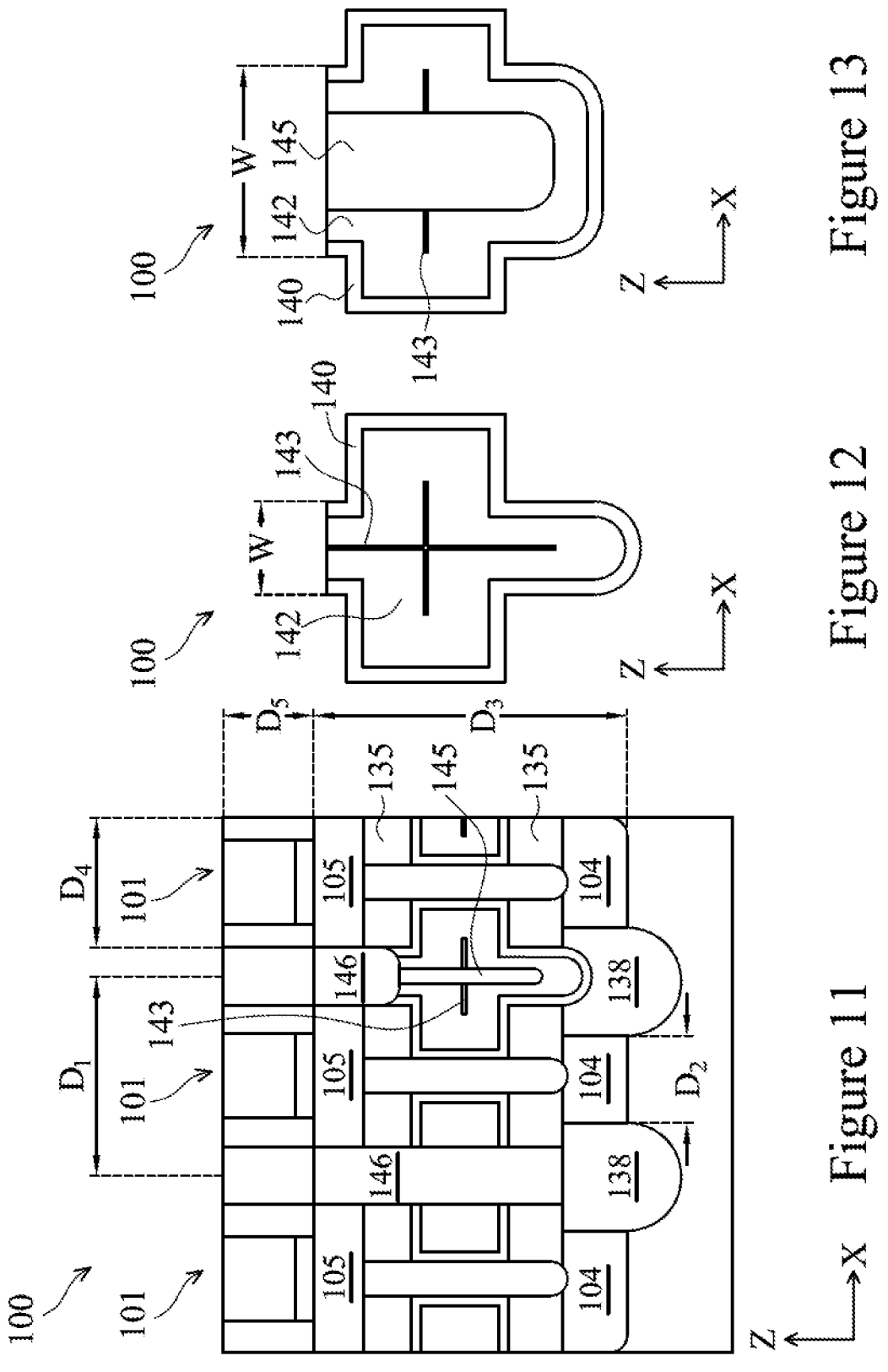

FIG. 11 is a cross-sectional view of the integrated circuit 100, in accordance with some embodiments. In particular, the view of FIG. 11 is at a stage of processing shown in FIG. 2D. However, the view of FIG. 11 illustrates the gate fill material 145 and the gap 143, as described in relation to FIG. 1O. FIG. 11 illustrates that the gate fill material 145 is present in the right trench 128 between the center and right transistors 101. The gate fill material 145 is not present in the left trench 128 between the left and center transistors 101 where the gate cut process has been performed to electrically isolate the gate electrodes of the left and center transistors. The gap 143 is also present in the right trench 128 and not present in the left trench 128.

In some embodiments, the transistors 101 and the dimension D1 corresponding to the gate pitch. The dimension D1 may be between 25 nm and 45 nm. The transistors 101 have a second dimension D2 corresponding to the space between the lower portions of the adjacent shallow trench isolation regions 138. The dimension D2 may be between 15 nm and 20 nm. The dimension D2 may correspond to the width of a source/drain region 104. The transistors 101 have a dimension D3 corresponding to a height of the transistors 101. In particular, D3 corresponds to the vertical distance between the bottom of the lower source/drain regions 104 and the top of the upper source/drain regions 105. The dimension D3 may be between 40 nm and 70 nm. The transistors 101 may have a dimension D4 corresponding to the width of the upper source/drain region 105. The dimension D4 may be between 15 nm and 30 nm. The transistors 101 may have a fifth dimension D5 corresponding to the height of the source/drain contact 152. The dimension D5 may correspond to the combined height of the source/drain contact 152 and the silicide 150. The dimension D5 may be between 5 nm and 20 nm. Other dimensions and configurations can be utilized for the transistors 101 without departing from the scope of the present disclosure. While the source/drain contact 152 is shown as separate from the silicide 150, the silicide 150 may be considered part of the source/drain contact 152.

FIGS. 12 and 13 enlarged cross-sectional views of the integrated circuit 100 at a stage of processing shown in FIG.

2D, in accordance with some embodiments. FIGS. 12 and 13 illustrate a dimension W corresponding to the width of the trenches 128. If W is sufficiently small, then the gate fill material 145 may not be present in the trench 128 because the gate metal 142 entirely fills the trench 128, leaving only a small seam 143 having a vertical portion and a horizontal portion, as shown in FIG. 12. If W is sufficiently large, then the gate fill material 145 may extend downward between the gate metal 142, as shown in FIG. 13. For FIG. 12, W may be between 15 nm and 20 nm, though other dimensions can be utilized without departing from the scope of the present disclosure. For FIG. 13, W may be greater than 30 nm, though other dimensions can be utilized without departing from the scope of the present disclosure.

Figure 14:
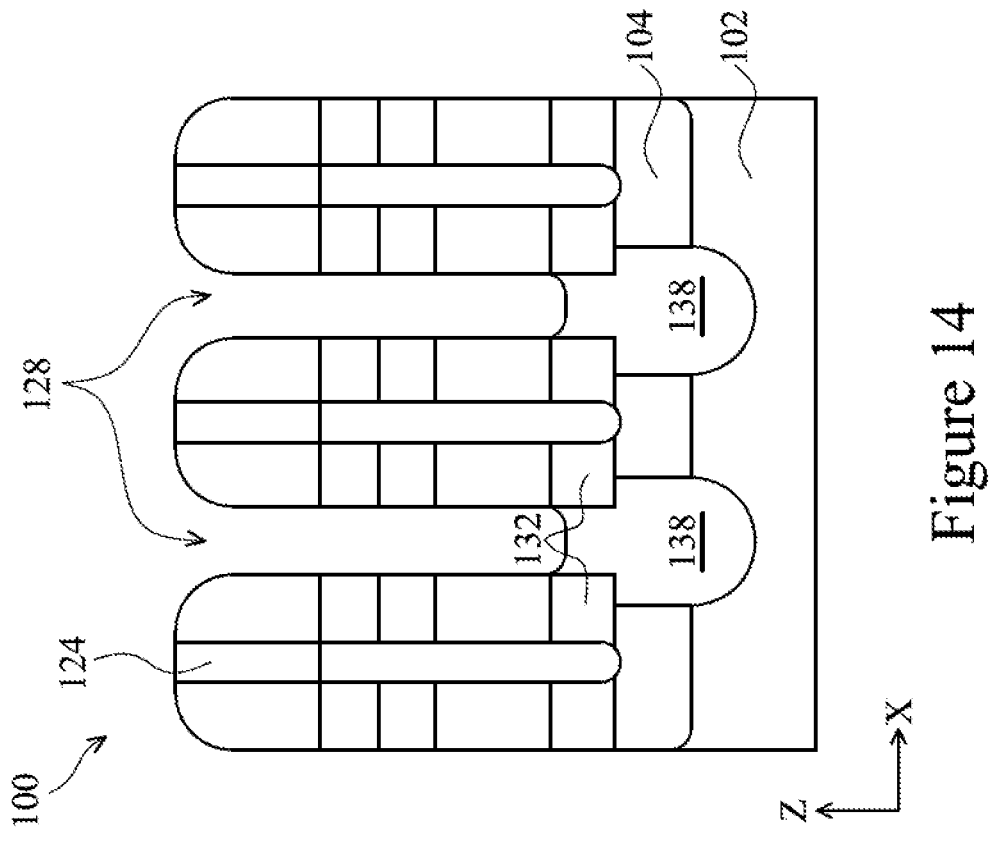

FIG. 14 is a cross-sectional view of an integrated circuit 100 at a stage of processing similar to the stage of processing shown in FIG. 1V, according to some embodiments. In FIG. 14, the trench isolation regions 138 have a top surface of extends higher than the top surface of the source/drain regions 104. In some embodiments, the top surface of the trench isolation regions 138 may be at a level lower than a top surface of the lower inner spacers 132 and higher than a bottom surface of the lower inner spacers 132. The trench isolation regions 138 can have other configurations without departing from the scope of the present disclosure.

Figure 15:
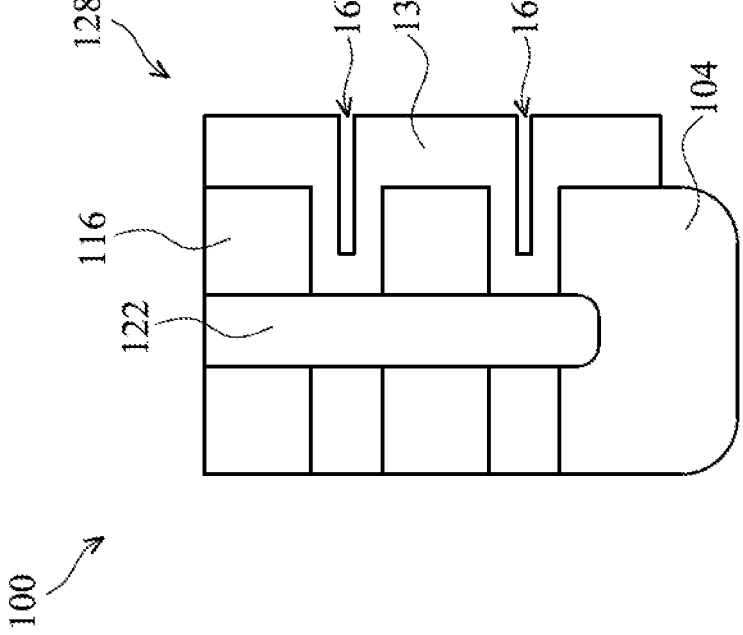

FIG. 15 is an enlarged cross-sectional view a portion of an integrated circuit 100 at a stage of processing intermediate to the stages of processing shown in FIGS. 1P and 1R, according to some embodiments. In FIG. 15, the dielectric material of the inner spacers 132 has been deposited in the trenches 128, but the etching process that removes the excess material of the inner spacers 132 from the trenches 128 has not yet been performed. FIG. 15 illustrates seams 161 formed in the inner spacers 132 as a result of a conformal deposition process. The seams 161 may be the same as the seams 135. The seams 161 may remain in the inner spacers 132 after processing is complete. This may correspond to a void in the inner spacers 132. Alternatively, the seams 161 may be filled with dielectric material from a subsequent deposition process, such as the gate dielectric material 140 or the interlevel dielectric layer 146.

FIG. 16 is a flow diagram of a method 1600 for forming an integrated circuit, in accordance with some embodiments. The method 1600 can utilize structures, components, and processes described in relation to FIGS. 1A-13. At 1602, the method 1600 includes forming, in a stack of semiconductor layers over a lower source/drain region of a first vertical transistor, a trench adjacent to a channel region of the first vertical transistor. One example of a first vertical transistor is the vertical transistor 101 of FIG. 2D. One example of a lower source/drain region is the lower source/drain region 104 of FIG. 1C. One example of a channel region is the channel region 122 of FIG. 2D. One example of a trench is the trench 128 of FIG. 1N. At 1604, the method 1600 includes exposing a portion of the channel region by selectively removing, via the trench with a first etching process, a first layer of the stack with respect to a second layer of the stack. One example of a first layer is the first semiconductor layer 110 of FIG. 1C. One example of a second layer is the second semiconductor layer 112 of FIG. 1C. At 1606, the method 1600 includes forming an upper inner spacer in contact with the channel region in place of the first layer. One example of an upper inner spacer is the upper inner spacer 132 of FIG. 1R. At 1608, the method 1600 includes removing the second layer of the stack via the trench with a second etching process. At 1610, the method 1600 includes forming a gate metal in place of the second layer. At 1612, the method 1600 includes forming an upper source/drain region of the first vertical transistor on the channel region and the upper inner spacer. One example of an upper source/drain region is the upper source/drain region 105 of FIG. 2D.

FIG. 17 is a flow diagram of a method 1700 for forming an integrated circuit, in accordance with some embodiments. The method 1700 can utilize structures, components, and processes described in relation to FIGS. 1A-13. At 1702, the method 1700 includes forming a first channel region of a first vertical transistor extending vertically from a first lower source/drain region of the first vertical transistor. One example of a first vertical transistor is the vertical transistor 101 of FIG. 2D. One example of a first channel region is the semiconductor nanostructure 122 of FIG. 2D. One example of a first lower source/drain region is the lower source/drain region 104 of FIG. 2D. At 1704, the method 1700 includes forming a first lower inner spacer in contact with the first channel region. One example of a first lower inner spacer is the lower inner spacer 132 of FIG. 2D. At 1706, the method 1700 includes forming, in a same deposition process as the first lower inner spacer, a first upper inner spacer above the first lower inner spacer and in contact with the first channel region. One example of a first upper inner spacer is the upper inner spacer 132 of FIG. 2D. At 1708, the method includes, after forming the first lower and upper inner spacers, forming a gate dielectric on a top of the first lower inner spacer, on a sidewall of the first channel region between the first upper and lower inner spacers, and on a bottom of the first upper inner spacer. One example of a gate dielectric is the gate dielectric 140 of FIG. 2D. At 1710, the method 1700 includes depositing a gate metal between the first upper and lower inner spacers. One example of a gate metal is the gate metal 142 of FIG. 2D. At 1712, the method 1700 includes forming an upper source/drain region of the first vertical transistor in contact with a top of the first channel region and a top of the first upper inner spacer. One example of an upper source/drain region is the upper source/drain region 105 of FIG. 2D.

Embodiments of the disclosure reduce active area spacing, and improve scaling of integrated circuit cell dimensions. In some embodiments, a vertical nanostructure transistor is formed. The vertical nanostructure transistor may include a lower source/drain region, and upper source/drain region, and a semiconductor nanostructure channel region extending vertically between the lower source/drain region and the upper source/drain region. A gate electrode laterally surrounds the semiconductor nanostructure channel region. The process for forming the vertical nanostructure transistor may include forming a stack of semiconductor layers having different material concentrations such that various layers of the semiconductor stack are selectively etchable with respect to each other. Formation of the stack of semiconductor layers enables precise control and definition of the dimensions of inner spacers, gate electrodes, and other structures of the vertical nanostructure transistor. The result is more efficient use of integrated circuit area, simpler and more compact formation of source/drain contacts, and reduction various other damages.

In one embodiment, a method includes forming, in a stack of semiconductor layers over a lower source/drain region of a first vertical transistor, a trench adjacent to a channel region of the first vertical transistor, exposing a portion of the channel region by selectively removing, via the trench with a first etching process, a first layer of the stack with respect to a second layer of the stack, and forming an upper inner spacer in contact with the channel region in place of the first layer. The method includes removing the second layer of the stack via the trench with a second etching process, forming a gate metal in place of the second layer, and forming an upper source/drain region of the first vertical transistor on the channel region and the upper inner spacer.

In one embodiment, a method includes forming a first channel region of a first vertical transistor extending vertically from a first lower source/drain region of the first vertical transistor, forming a first lower inner spacer in contact with the first channel region, and forming, in a same deposition process as the first lower inner spacer, a first upper inner spacer above the first lower inner spacer and in contact with the first channel region. The method includes after forming the first lower and upper inner spacers, forming a gate dielectric on a top of the first lower inner spacer, on a sidewall of the first channel region between the first upper and lower inner spacers, and on a bottom of the first upper inner spacer, depositing a gate metal between the first upper and lower inner spacers, and forming an upper source/drain region of the first vertical transistor in contact with a top of the first channel region and a top of the first upper inner spacer.

In one embodiment, a device includes a first vertical transistor. The first vertical transistor includes a first lower source/drain region, a first channel region extending vertically from the first lower source/drain region, a first lower inner spacer in contact with the first channel region and the first lower source/drain region, and a first gate electrode positioned on the first lower inner spacers and laterally surrounding the first channel region. The device includes a shallow trench isolation region in contact with the first lower source/drain region and an interlevel dielectric layer extending vertically from the shallow trench isolation region and in contact with sidewalls of the first lower inner spacer and the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, in a stack of semiconductor layers over a lower source/drain region of a first vertical transistor, a trench adjacent to a channel region of the first vertical transistor;

exposing a portion of the channel region by selectively removing, via the trench with a first etching process, a first layer of the stack with respect to a second layer of the stack;

forming an upper inner spacer in contact with the channel region in place of the first layer;

removing the second layer of the stack via the trench with a second etching process;

forming a gate metal in place of the second layer; and forming an upper source/drain region of the first vertical transistor on the channel region and the upper inner spacer.

2. The method of claim 1, wherein the first etching process removes a third layer of the stack, wherein the second layer is positioned between the first layer and the third layer prior to the first etching process.

3. The method of claim 2, comprising forming, in place of the third layer, a lower inner spacer in contact with the channel region and the lower source/drain region.

4. The method of claim 3, comprising:

removing the gate metal from the trench with a third etching process; and filling the trench with a first interlevel dielectric layer in contact with remaining a portion of the gate metal and the upper and lower inner spacers after the second etching process.

5. The method of claim 4, comprising removing, via the trench, a portion of the source/drain region below the lower inner spacer prior to forming the gate metal.

6. The method of claim 5, comprising forming a shallow trench isolation region by depositing a dielectric material in a bottom of the trench and in contact with a bottom surface of the lower inner spacer.

7. The method of claim 6, wherein the first interlevel dielectric layer is in contact with the dielectric material of the shallow trench isolation region.

8. The method of claim 4, comprising:

forming a second interlevel dielectric layer on the interlevel dielectric layer and on the upper source/drain region;

patterning the second interlevel dielectric layer to expose the upper source/drain region; and forming a source/drain contact in the second interlevel dielectric layer in contact with the upper source/drain region.

9. The method of claim 8, wherein patterning the second interlevel dielectric layer includes exposing an upper source drain region of a second vertical transistor, wherein forming the source/drain contact includes depositing a source/drain metal in the second interlevel dielectric layer electrically connecting the upper source/drain region of the first vertical transistor to the upper source/drain region of the second vertical transistor.

10. The method of claim 2, wherein the first and third layers include silicon germanium having a first concentration of germanium, wherein the second layer includes silicon germanium having a second concentration of germanium different than the first concentration.

11. A method, comprising:

forming a first channel region of a first vertical transistor extending vertically from a first lower source/drain region of the first vertical transistor;

forming a first lower inner spacer in contact with the first channel region;

forming, in a same deposition process as the first lower inner spacer, a first upper inner spacer above the first lower inner spacer and in contact with the first channel region;

after forming the first lower and upper inner spacers, forming a gate dielectric on a top of the first lower inner spacer, on a sidewall of the first channel region between the first upper and lower inner spacers, and on a bottom of the first upper inner spacer;

depositing a gate metal between the first upper and lower inner spacers; and forming an upper source/drain region of the first vertical transistor in contact with a top of the first channel region and a top of the first upper inner spacer.

12. The method of claim 11, comprising:

forming a second channel region of a second vertical transistor extending vertically from a second lower source/drain region of the second vertical transistor;

forming a second lower inner spacer in contact with the second channel region;

forming, in a same deposition process as the second lower inner spacer, a second upper inner spacer above the second lower inner spacer and in contact with the second channel region;

after forming the second lower and upper inner spacers, forming the gate dielectric on a top of the second lower inner spacer, on a sidewall of the second channel region between the second upper and lower inner spacers, and on a bottom of the second upper inner spacer;

depositing the gate metal between the second upper and lower inner spacers; and forming an upper source/drain region of the second vertical transistor in contact with a top of the second channel region and a top of the second upper inner spacer.

13. The method of claim 12, comprising:

forming a first shallow trench isolation region separating the first and second lower source/drain regions; and electrically isolating the gate metal of the first vertical transistor by removing a portion of the gate metal above the first shallow trench isolation region with an etching process; and depositing an interlevel dielectric layer between a first portion of the gate metal corresponding to a gate electrode of the first vertical transistor and a second portion of the gate metal corresponding to a gate electrode of the second vertical transistor, wherein the interlevel dielectric layer is in contact with a top of the first shallow trench isolation region.

14. The method of claim 13, comprising:

forming a third channel region of a third vertical transistor extending vertically from a third lower source/drain region of the third vertical transistor;

forming a third lower inner spacer in contact with the third channel region;

forming, in a same deposition process as the third lower inner spacer, a third upper inner spacer above the third lower inner spacer and in contact with the third channel region;

after forming the third lower and upper inner spacers, forming the gate dielectric on a top of the third lower inner spacer, on a sidewall of the third channel region between the third upper and lower inner spacers, and on a bottom of the third upper inner spacer;

depositing the gate metal between the third upper and lower inner spacers;

forming an upper source/drain region of the third vertical transistor in contact with a top of the third channel region and a top of the third upper inner spacer;

forming a second shallow trench isolation region separating the second and third lower source/drain regions; and protecting the gate metal between the second channel region and the third channel region from the etching process such that the gate electrode of the second vertical transistor is shorted with a gate electrode of the third vertical transistor.

15. The method of claim 14, wherein the gate dielectric is in contact with the second shallow trench isolation region and is not in contact with the first shallow trench isolation region.

16. The method of claim 12, wherein a void is present in the gate metal between the first and second channel regions.

17. A device, comprising:

a first vertical transistor, including:

a first lower source/drain region;

a first channel region extending vertically from the first lower source/drain region;

a first lower inner spacer in contact with the first channel region and the first lower source/drain region; and a first gate electrode positioned on the first lower inner spacers and laterally surrounding the first channel region;

a shallow trench isolation region in contact with the first lower source/drain region;

an interlevel dielectric layer extending vertically from the shallow trench isolation region and in contact with sidewalls of the first lower inner spacer and the first gate electrode; and a second vertical transistor, including:

a second lower source/drain region in contact with the shallow trench isolation region;

a second channel region extending vertically from the second lower source/drain region;

a second lower inner spacer in contact with the second channel region and the second lower source/drain region; and a second gate electrode positioned between a second upper inner spacer and the second lower inner spacers, wherein an interlevel dielectric layer is in contact with sidewalls of the second lower inner spacer and the first gate electrode and is positioned between the first and second lower inner spacers and between the first and second gate electrodes.

18. The device of claim 17, wherein the first lower inner spacer includes a void.

19. The device of claim 17, wherein the first gate electrode includes a void.

20. The device of claim 17, wherein the first lower source/drain region includes silicon germanium.

* * * * *